(12) United States Patent
Yanagisawa

(10) Patent No.: US 11,092,642 B2
(45) Date of Patent: Aug. 17, 2021

(54) ELECTRONIC COMPONENT HANDLER AND ELECTRONIC COMPONENT TESTER

(71) Applicant: NS Technologies, Inc., Okaya (JP)

(72) Inventor: Makoto Yanagisawa, Matsumoto (JP)

(73) Assignee: NS Technologies, Inc.

( * ) Notice: Subject to any disclaimer, the term of this patent is extended or adjusted under 35 U.S.C. 154(b) by 68 days.

(21) Appl. No.: 16/583,436

(22) Filed: Sep. 26, 2019

(65) Prior Publication Data
US 2020/0103463 A1 Apr. 2, 2020

(30) Foreign Application Priority Data

Sep. 27, 2018 (JP) .............................. JP2018-182810

(51) Int. Cl.
*G01R 31/28* (2006.01)
*B25J 15/06* (2006.01)

(52) U.S. Cl.
CPC ...... *G01R 31/2893* (2013.01); *B25J 15/0633* (2013.01)

(58) Field of Classification Search
CPC .......................... B25J 15/0625; B25J 15/0633; B25J 15/0052; G01R 31/2806; G01R 31/2808; G01R 31/2829; G01R 31/2851; G01R 31/2867; G01R 31/2893; G01R 35/00; G01R 31/2601
See application file for complete search history.

(56) References Cited

U.S. PATENT DOCUMENTS

| 9,689,916 B2 * | 6/2017 | Yamada | G01R 31/2891 |
| 2014/0312924 A1 * | 10/2014 | Imai | G01R 31/2893 |
| | | | 324/750.08 |

FOREIGN PATENT DOCUMENTS

| JP | H05-072067 A | 3/1993 |
| JP | H07-124882 A | 5/1995 |
| JP | 2002-270481 A | 9/2002 |
| JP | 2003-110290 A | 4/2003 |
| JP | 2003-204197 A | 7/2003 |
| WO | WO-1993-004963 A1 | 3/1993 |

* cited by examiner

*Primary Examiner* — Nasima Monsur
*Assistant Examiner* — Courtney G McDonnough
(74) *Attorney, Agent, or Firm* — Harness, Dickey & Pierce, P.L.C.

(57) ABSTRACT

An electronic component handler including a first holding section and a second holding section holding an electronic component by adsorption, a suction section giving the first holding section and the second holding section an adsorption force to adsorb the electronic component, a suction flow path, a first branch flow path, a second branch flow path, a first opening/closing section opening and closing the first branch flow path, a second opening/closing section opening and closing the second branch flow path, a first pressure measurement section measuring first pressure inside the first branch flow path, a second pressure measurement section measuring second pressure inside the second branch flow path, and a control section, in which the control section opens the first branch flow path by the first opening/closing section and causes the first holding section to adsorb the electronic component, and checks whether or not the first pressure is lower than preset pressure when the second branch flow path is opened by the second opening/closing section.

10 Claims, 14 Drawing Sheets

ELECTRONIC COMPONENT HANDLER AND ELECTRONIC COMPONENT TESTER

The present application is based on, and claims priority from, JP Application Serial Number 2018-182810, filed Sep. 27, 2018, the disclosure of which is hereby incorporated by reference herein in its entirety.

BACKGROUND

1. Technical Field

The present disclosure relates to an electronic component handler and an electronic component tester.

2. Related Art

An example of a tester electrically testing a sample such as an IC device or the like includes an automatic sample collection system described in JP-A-2002-270481. The automatic sample collection system described in JP-A-2002-270481 has a sample position alignment section that aligns and arranges the sample, a sample test section performing a sample test, and a sample transporter transporting the sample between the sample position alignment section and the sample test section. Further, the sample transporter, the sample position alignment section, and the sample test section respectively have a vacuum drawing tube and a vacuum sensor measuring pressure in the vacuum drawing tube, and it is possible to vacuum-adsorb the sample by reducing the pressure inside the vacuum drawing tube.

Further, the automatic collection system having such a configuration undertakes an adsorption operations of the sample in the sample transport device, the sample position alignment section and the sample test section respectively and, at that time, can determine the presence or absence of the sample in the sample transport device, the sample position alignment section, and the sample test section from on/off of a detection signal output from each vacuum sensor.

However, in the automatic collection system described in JP-A-2002-270481, when deterioration or the like occurs in a vacuum source, for example, a problem such as an inability to vacuum-adsorb a sample occurs, depending on a degree of the deterioration.

SUMMARY

The present disclosure can be implemented as the following aspects.

An electronic component handler according to an aspect of the present disclosure transports a first electronic component and a second electronic component to a test section testing electrical characteristics of the first electronic component and the second electronic component. The electronic component handler includes a first holding section holding the first electronic component by adsorption, a second holding section holding the second electronic component by adsorption, a suction section giving the first holding section an adsorption force to adsorb the first electronic component and giving the second holding section the adsorption force to adsorb the second electronic component, a suction flow path which communicates with the suction section and through which gas is sucked by the suction section, a first branch flow path which branches off from the suction flow path and communicates with the first holding section and through which the gas is sucked by the suction section, a second branch flow path which branches off from the suction flow path and communicates with the second holding section and through which the gas is sucked by the suction section, a first opening/closing section opening and closing the first branch flow path, a second opening/closing section opening and closing the second branch flow path, a first pressure measurement section measuring first pressure inside the first branch flow path, a second pressure measurement section measuring second pressure inside the second branch flow path, and a control section controlling an operation of the suction section, the first opening/closing section, the second opening/closing section, the first pressure measurement section, and the second pressure measurement section, in which the control section opens the first branch flow path by the first opening/closing section and causes the first holding section to adsorb the first electronic component, and checks whether or not the first pressure measured when the second branch flow path is opened by the second opening/closing section is lower than preset pressure.

DESCRIPTION OF EXEMPLARY EMBODIMENTS

An electronic component handler and electronic component tester according to the present disclosure will be described in detail based on preferred embodiments shown in attached drawings in the following.

First Embodiment

Figure 1:
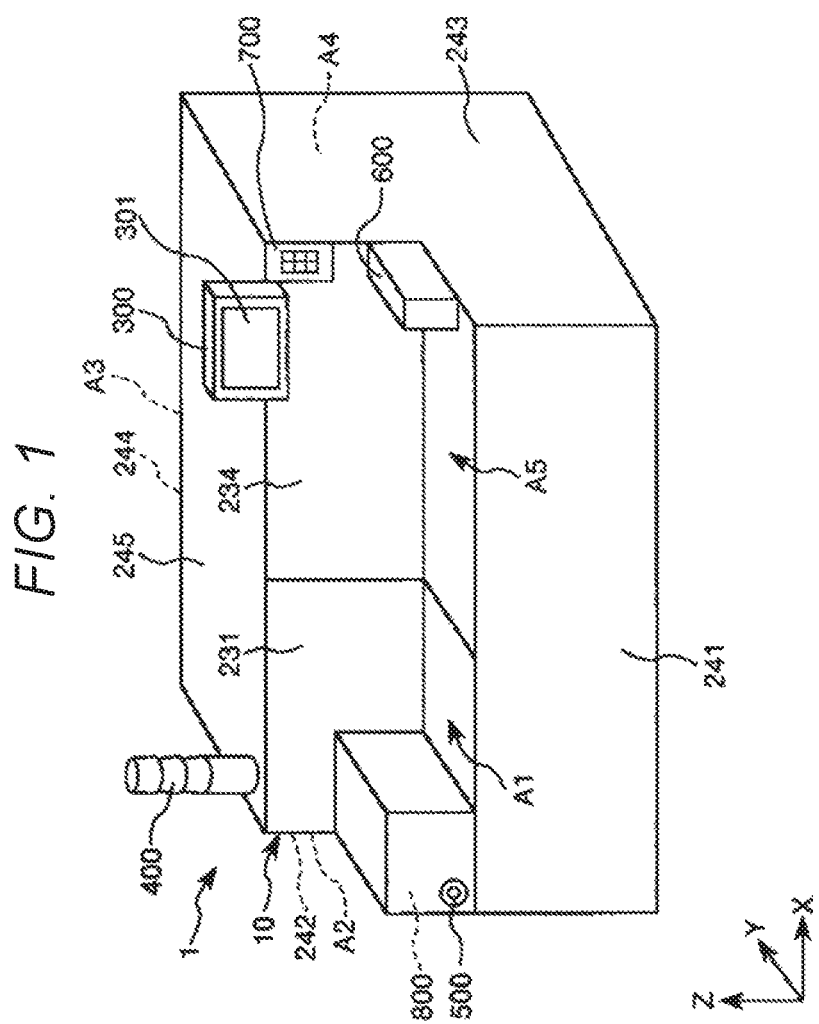
FIG. 1 is a schematic perspective view of an electronic component tester according to a first embodiment as viewed from a front side.

A first embodiment of the electronic component handler and the electronic component tester according to the present disclosure will be described with reference to FIGS. 1 to 18 in the following. As shown in FIG. 1, three axes orthogonal to one another are taken as X-axis, Y-axis, and Z-axis for the convenience of description in the following. Further, an XY plane including the X-axis and Y-axis is horizontal and the Z-axis is vertical. Further, a direction parallel to the X-axis is also referred to as "X-axis direction", a direction parallel to the Y-axis is referred to as "Y-axis direction", and a direction parallel to the Z-axis is referred to as "Z-axis direction". Further, the direction which an arrow of each direction points is referred to as "positive" and the opposite direction is referred to as "negative". Further, "horizontal" referred to in the present specification is not limited to perfect horizontally and includes a state of a slight inclination (approximately ±5°, for example) to an extent that transport of an electronic component is not hindered. Further, the positive side of the Z-axis direction is sometimes referred to as "upper" and the negative side of the Z-axis direction is referred to as "lower".

An electronic component handler 10 is a handler having an appearance shown in FIG. 1. Further, as shown in FIG. 2, an electronic component tester 1 includes the electronic component handler 10 and further includes a test section 16 testing an electronic component.

A configuration of each unit will be described in detail in the following.

Figure 2:
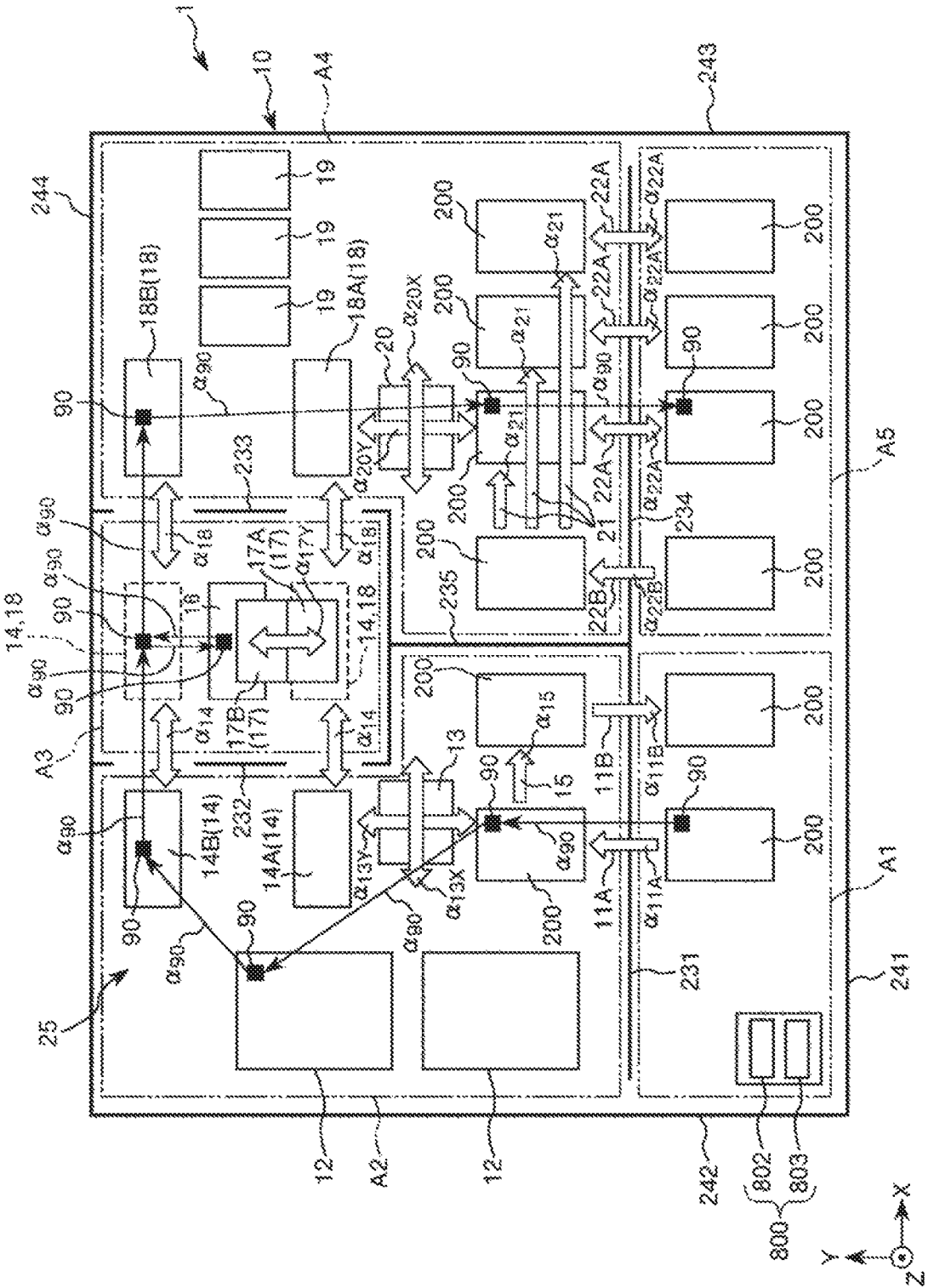
FIG. 2 is a schematic plan view showing an operation state of the electronic component tester shown in FIG. 1.

As shown in FIGS. 1 and 2, the electronic component tester 1 including the electronic component handler 10 transports an electronic component such as an IC device, which is a ball grid array (BGA) package, or the like, for example, and tests and examines (hereinafter, simply referred to as "test") electrical characteristics of the electronic component in a transport process thereof. For the convenience of description, a case where an IC device is used as an electronic component will be described as a representative in the following, and this will be referred to as "IC device 90". In the present embodiment, the IC device 90 has a flat plate shape and is rectangular or square in plan view. The shape of the IC device 90 in plan view is not limited to a rectangle or a square and may have a rounded shape such as a circle or an ellipse.

In addition to the above, examples of the IC device are "large scale integration (LSI)", "complementary MOS (CMOS)", "charge coupled device (CCD)", "module IC" in which an IC device is packaged into a plurality of modules, "crystal device", "pressure sensor", "inertial sensor (acceleration sensor)", "gyro sensor", "fingerprint sensor" and the like.

The electronic component tester 1 includes a tray supply area A1, a device supply area A2, a test area A3, a device collection area A4, and a tray removal area A5, and these areas are divided by respective wall portions as described below. Then, the IC device 90 sequentially passes through each of the areas from the tray supply area A1 to the tray removal area A5 in the arrow α90 direction and a test is performed in the test area A3 in the middle. As described above, the electronic component tester 1 includes the electronic component handler 10 having a transporter 25 transporting the IC device 90 to pass through each area, a test section 16 performing a test in the test area A3, and a control section 800. Further, the electronic component tester 1 includes a monitor 300, a signal lamp 400, and an operation panel 700.

In the electronic component tester 1, the side where the tray supply area A1 and the tray removal area A5 are disposed, that is, a lower side in FIG. 2, is used as a front side and the side where the test area A3 is disposed, that is, an upper side in FIG. 2, is used as a rear side.

Further, in the electronic component tester 1, what is called "change kit" to be replaced for each type of IC device 90 is disposed and placed in advance for use. In the present embodiment, the change kit includes a temperature adjustment section 12, a device supply section 14, and a device collection unit 18. Further, there are also a tray 200 prepared by a user, a collection tray 19, and a test section 16 besides the change kit as described above.

The tray supply area A1 is a material supply section to which the tray 200 is supplied. The tray 200 is a container in which a plurality of IC devices 90 yet to be tested are arranged in a matrix and placed. The tray supply area A1 can also be referred to as a mounting area where a plurality of trays 200 can be stacked and mounted. In the present embodiment, each tray 200 has a plurality of recesses arranged in a matrix form. It is possible to store and place one IC device 90 in each recess.

In the device supply area A2, a plurality of IC devices 90 on the tray 200 transported from the tray supply area A1 are respectively transported and supplied to the test area A3. A tray transport mechanism 11A and a tray transport mechanism 11B transporting the tray 200 in the horizontal direction one by one are provided across the tray supply area A1 and the device supply area A2. The tray transport mechanism 11A is a part of the transporter 25 and can move the tray 200 together with the IC device 90 placed in the tray 200 to the positive side in the Y-axis direction, that is, in the arrow α11A direction in FIG. 2. In this way, it is possible to stably feed the IC device 90 to the device supply area A2. Further, the tray transport mechanism 11B can move an empty tray 200 to the negative side of the Y-axis direction, that is, in the arrow α11B direction in FIG. 2. In this way, it is possible to move the empty tray 200 from the device supply area A2 to the tray supply area A1.

The temperature adjustment section 12, a device transport arm 13, and a tray transport mechanism 15 are provided in the device supply area A2. The temperature adjustment section 12 is referred to as a soak plate which is "soak plate"

in English and "soaking plate", for example, in Chinese. Further, a device supply section 14 moving across the device supply area A2 and the test area A3 is also provided.

A plurality of the IC devices 90 are placed in the temperature adjustment section 12 and it is possible to collectively heat or cool the IC devices 90 placed. In this way, it is possible to adjust the IC device 90 to the temperature suitable for the test by heating or cooling before being tested by the test section 16.

Such a temperature adjustment section 12 is fixed. In this way, it is possible to stably adjust the temperature of the IC device 90 on the temperature adjustment section 12. Further, the temperature adjustment section 12 is grounded.

In the configuration shown in FIG. 2, two temperature adjustment sections 12 are fixedly disposed in the Y-axis direction. Then, the IC device 90 on the tray 200 transported from the tray supply area A1 by the tray transport mechanism 11A is transported to either of the temperature adjustment sections 12.

The device transport arm 13 can hold and transport the IC device 90 and is movably supported in the device supply area A2. The device transport arm 13 is also a part of the transporter 25, and takes charge of the transport of the IC device 90 between the tray 200 transported from the tray supply area A1 and the temperature adjustment section 12 and the transport of the IC device 90 between the temperature adjustment section 12 and a device supply section 14 to be described below. The movement of the device transport arm 13 in the X-axis direction is denoted by an arrow α13X and the movement of the device transport arm 13 in the Y-axis direction is denoted by an arrow α13Y in FIG. 2.

The device supply section 14 is referred to as a "supply shuttle plate" or simply "supply shuttle" in which a temperature-adjusted IC device 90 is placed and which can transport the IC device 90 to a vicinity of the test section 16.

Further, the device supply section 14 is supported so as to reciprocate between the device supply area A2 and the test area A3 in the X-axis direction, that is, in the arrow α14 direction. In this way, the device supply section 14 can stably transport the IC device 90 from the device supply area A2 to the vicinity of the test section 16 in the test area A3 and can return to the device supply area A2 again after the IC device 90 is removed by a device transport arm 17 in the test area A3.

In the configuration shown in FIG. 2, two device supply sections 14 are disposed in the Y-axis direction. The device supply section 14 on the negative side in the Y-axis direction is referred to as a "device supply section 14A" and the device supply section 14 on the positive side in the Y-axis direction is referred to as a "device supply section 14B". Then, the IC device 90 on the temperature adjustment section 12 is transported to the device supply section 14A or the device supply section 14B in the device supply area A2. Further, like the temperature adjustment section 12, the device supply section 14 is configured to heat or cool the IC device 90 placed in the device supply section 14. In this way, it is possible to maintain a temperature-adjusted state of the temperature-adjusted IC device 90 by the temperature adjustment section 12 and transport the IC device 90 to the vicinity of the test section 16 in the test area A3. Further, like the temperature adjustment section 12, the device supply section 14 is also grounded.

As shown in FIGS. 3 to 15, the device supply section 14 has a plurality of recesses 141. It is possible to store and place one IC device 90 in each recess 141. In the present embodiment, four recesses 141 are arranged at equal intervals in the X-axis direction. In the following, the recesses 141 are sequentially referred to as a "first recess 141a", a "second recess 141b", a "third recess 141c", and a "fourth recess 141d" from the X-axis direction negative side. The IC device 90, which is a first electronic component, is placed in the first recess 141a, the IC device 90, which is a second electronic component, is placed in the second recess 141b, the IC device 90, which is a third electronic component, is placed in the third recess 141c, and the IC device 90, which is a fourth electronic component, is placed in the fourth recess 141d.

Four recesses 141 are disposed in the present embodiment, but the present disclosure is not limited thereto. The number of dispositions may be one, two, three, five or more, for example. Further, when a plurality of recesses 141 are disposed, the number of dispositions in the X-axis direction and the number of dispositions in the Y-axis direction are not particularly limited.

The tray transport mechanism 15 transports an empty tray 200 in a state where the whole IC devices 90 are removed to the positive side in the X-axis direction, that is, in the arrow α15 direction, in the device supply area A2. Then, after the transport, the empty tray 200 is returned from the device supply area A2 to the tray supply area A1 by the tray transport mechanism 11B.

The IC device 90 is tested in the test area A3. The test section 16 performing a test on the IC device 90 and the device transport arm 17 are provided in the test area A3.

The device transport arm 17 is a part of the transporter 25 and, like the temperature adjustment section 12, is configured to heat or cool the IC device 90 held. In this way, it is possible to hold the IC device 90 in which the temperature-adjusted state is maintained and transport the IC device 90 to the test area A3 in the temperature-adjusted state.

Such device transport arm 17 is supported so as to reciprocate in the Y-axis direction and the Z-axis direction in the test area A3 and is a part of a mechanism called an "index arm". In this way, the device transport arm 17 can lift the IC device 90 from the device supply section 14 transported from the device supply area A2 and transport and place the IC device 90 on the test section 16.

The reciprocation of the device transport arm 17 in the Y-axis direction is denoted by an arrow α17Y in FIG. 2. Further, the device transport arm 17 is supported so as to reciprocate in the Y-axis direction, but the present disclosure is not limited thereto. The device transport arm 17 is also supported so as to reciprocate in the X-axis direction. Further, in the configuration shown in FIG. 2, two device transport arms 17 are disposed in the Y-axis direction. The device transport arm 17 on the negative side in the Y-axis direction is referred to as a "device transport arm 17A" and the device transport arm 17 on the positive side in the Y-axis direction is referred to as a "device transport arm 17B". The device transport arm 17A can take charge of the transport of the IC device 90 from the device supply section 14A to the test section 16 in the test area A3, and the device transport arm 17B can take charge of the transport of the IC device 90 from the device supply section 14B to the test section 16 in the test area A3.

As shown in FIGS. 3 to 15, the device transport arm 17 includes an arm main body 3, a first holding unit 4a, a second holding unit 4b, a third holding unit 4c, a fourth holding unit 4d and a suction unit 5.

The arm main body 3 includes a flow path formation section 35 having a suction flow path 30 through which the gas GS is sucked by a suction section 51 of the suction unit 5, a first branch flow path 31 branching off from the suction flow path 30, a second branch flow path 32 branching off from the suction flow path 30, a third branch flow path 33 branching off from the suction flow path 30, and a fourth branch flow path 34 branching off from the suction flow path 30.

The suction unit 5 has a suction section 51 and a coupling tube 52 coupling the suction section 51 and the suction flow path 30.

The suction section 51 communicates with the suction flow path 30 through the coupling tube 52. Then, the gas GS in the suction flow path 30 and the first branch flow path 31 to the fourth branch flow path 34 communicating with the suction flow path 30 is sucked by the operation of the suction section 51. In this way, it is possible to give the adsorption force F to adsorb the IC device 90 to each of a first holding section 41a of the first holding unit 4a, a second holding section 41b of the second holding unit 4b, a third holding section 41c of the third holding unit 4c, and a fourth holding section 41d of the fourth holding unit 4d.

The suction section 51 is configured with a pump 511. The pump 511 is not particularly limited, and it is preferable that a vacuum pump is used.

The first holding unit 4a, the second holding unit 4b, the third holding unit 4c, and the fourth holding unit 4d are arranged at equal intervals in the X-axis direction on a lower side of the arm main body 3. It is preferable that the device transport arm 17 is configured to adjust the intervals between the holding units in the X-axis direction.

The first holding unit 4a includes the first holding section 41a holding the IC device 90 by adsorption, a first opening/closing section 42a opening and closing the first branch flow path 31, and a first pressure measurement section 43a detecting a first pressure P1 inside the first branch flow path 31.

The first holding section 41a is a first head having a tubular shape and having an adsorption pad 44a adsorbing the IC device 90 on its lower side. Further, an inner cavity portion of the first holding section 41a communicates with the first branch flow path 31 and forms a part of the first branch flow path 31.

A first opening/closing section 42a as a first valve opening and closing the first branch flow path 31 is provided in the middle of the first holding section 41a. It is preferable that the first opening/closing section 42a is configured with a solenoid valve, for example.

Further, the first pressure measurement section 43a as a first sensor measuring the first pressure P1 inside the first branch flow path 31 is provided below the first opening/closing section 42a in the middle of the first holding section 41a. The first pressure measurement section 43a can be a vacuum sensor having a diaphragm and a strain gauge which is provided on the surface of the diaphragm and which incorporates a piezo element. In this case, the first pressure measurement section 43a can turn a change of electrical resistance due to a piezo resistance effect generated in the strain gauge along with the deformation of the diaphragm depending on the degree of the pressure into an electrical signal and output the electrical signal to the control section 800. Further, the first pressure measurement section 43a outputs a signal (first signal), such as an OFF signal, for example, indicating that the first pressure P1 is lower than a threshold value P0 when the first pressure P1 is lower than the set threshold value P0 and outputs a signal (second signal) such as an ON signal, for example, indicating that the first pressure P1 is equal to or higher than the set threshold value P0 when the first pressure P1 is equal to or greater than the set threshold value P0.

It should be noted the configuration may be such that only the signal indicating that the first pressure P1 is lower than the threshold value P0 is output and that the signal indicating that the first pressure P1 is equal to or greater than the threshold value P0 is not output.

Further, the configuration may be such that only the signal indicating that the first pressure P1 is equal to or greater than the threshold value P0 is output and that the signal is not output when the first pressure P1 is lower than the threshold value P0.

The second holding unit 4b has a second holding section 41b holding the IC device 90 by adsorption, a second opening/closing section 42b opening and closing the second branch flow path 32, and a second pressure measurement section 43b measuring second pressure P2 inside the second branch flow path 32.

The second holding section 41b is a second head having a tubular shape and having an adsorption pad 44b adsorbing the IC device 90 in its lower portion. Further, the inner cavity portion of the second holding section 41b communicates with the second branch flow path 32 and forms a part of the second branch flow path 32.

A second opening/closing section 42b as a second valve opening and closing the second branch flow path 32 is provided in the middle of the second holding section 41b. It is preferable that, like the first opening/closing section 42a, the second opening/closing section 42b is configured with a solenoid valve.

Further, a second pressure measurement section 43b as a second sensor measuring the second pressure P2 inside the second branch flow path 32 is provided below the second opening/closing section 42b in the middle of the second holding section 41b. Like the first pressure measurement section 43a, for example, the second pressure measurement section 43b can be a vacuum sensor having a diaphragm and a strain gauge which is provided on the surface of the diaphragm and which incorporates a piezo element.

The third holding unit 4c has a third holding section 41c holding the IC device 90 by adsorption, a third opening/closing section 42c opening and closing the third branch flow path 33, and a third pressure measurement section 43c measuring third pressure P3 inside the third branch flow path 33.

The third holding section 41c is a third head having a tubular shape and having an adsorption pad 44c adsorbing the IC device 90 in its lower portion. Further, the inner cavity portion of the third holding section 41c communicates with the third branch flow path 33 and forms a part of the third branch flow path 33.

A third opening/closing section 42c as a third valve opening and closing the third branch flow path 33 is provided in the middle of the third holding section 41c. It is preferable that, like the first opening/closing section 42a, the third opening/closing section 42c is configured with a solenoid valve, for example.

Further, a third pressure measurement section 43c as a third sensor measuring third pressure P3 inside the third branch flow path 33 is provided below the third opening/closing section 42c in the middle of the third holding section 41c. Like the first pressure measurement section 43a, for example, the third pressure measurement section 43c can be a vacuum sensor having a diaphragm and a strain gauge which is provided on the surface of the diaphragm and which incorporates a piezo element.

The fourth holding unit 4d has a fourth holding section 41d holding the IC device 90 by adsorption, a fourth opening/closing section 42d opening and closing the fourth branch flow path 34, and a fourth pressure measurement section 43*d* measuring fourth pressure P4 inside the fourth branch flow path 34.

The fourth holding section 41*d* is a fourth head having a tubular shape and having an adsorption pad 44*d* adsorbing the IC device 90 in its lower portion. Further, the inner cavity portion of the fourth holding section 41*d* communicates with the fourth branch flow path 34 and forms a part of the fourth branch flow path 34.

A fourth opening/closing section 42*d* as a fourth valve opening and closing the fourth branch flow path 34 is provided in the middle of the fourth holding section 41*d*. It is preferable that, like the first opening/closing section 42*a*, the fourth opening/closing section 42*d* is configured with a solenoid valve.

Further, a fourth pressure measurement section 43*d* as a fourth sensor measuring fourth pressure P4 inside the fourth branch flow path 34 is provided below the fourth opening/closing section 42*d* in the middle of the fourth holding section 41*d*. Like the first pressure measurement section 43*a*, for example, the fourth pressure measurement section 43*d* can be a vacuum sensor having a diaphragm and a strain gauge which is provided on the surface of the diaphragm and which incorporates a piezo element.

The device transport arm 17 includes a total of four holding units from the first holding unit 4*a* to the fourth holding unit 4*d* in the configurations shown in FIGS. 3 to 15, but the number of the holding units disposed is not limited thereto and may be two, three, five or more, for example. Further, when a plurality of holding units are disposed, the number of dispositions in the X-axis direction and the number of dispositions in the Y-axis direction are not particularly limited.

Further, the suction section 51, the first opening/closing section 42*a*, the second opening/closing section 42*b*, the third opening/closing section 42*c*, the fourth opening/closing section 42*d*, the first pressure measurement section 43*a*, the second pressure measurement section 43*b*, the third pressure measurement section 43*c*, and the fourth pressure measurement section 43*d* are electrically coupled to the control section 800 respectively. In this way, a processor 802 of the control section 800 can control the operations of the suction section 51, the first opening/closing section 42*a* to the fourth opening/closing section 42*d*, and the first pressure measurement section 43*a* to the fourth pressure measurement section 43*d* respectively.

A plurality of IC devices 90 which are tested in the test area A3 and of which the test is completed are collected in the device collection area A4. The collection tray 19, a device transport arm 20, and a tray transport mechanism 21 are provided in the device collection area A4. Further, the device collection unit 18 moving across the test area A3 and the device collection area A4 is also provided. Further, the empty tray 200 is also prepared in the device collection area A4.

The device collection unit 18, in which the IC device 90, of which the test is completed by the test section 16, is placed and which transports the IC device 90 to the device collection area A4 is called a "collection shuttle plate" or simply a "collection shuttle". The device collection unit 18 can also be a part of the transporter 25.

Further, the device collection unit 18 is supported so as to reciprocate between the test area A3 and the device collection area A4 in the X-axis direction, that is, in the arrow α18 direction. Further, in the configuration shown in FIG. 2, like the device supply section 14, two device collection units 18 are disposed in the Y-axis direction. The device collection unit 18 on the negative side in Y-axis direction is referred to as "device collection unit 18A" and the device collection unit 18 on the positive side in the Y-axis direction is referred to as "device collection unit 18B". Then, the IC device 90 on the test section 16 is transported to the device collection unit 18A or the device collection unit 18B and placed therein. The device transport arm 17A takes charge of the transport of the IC device 90 from the test section 16 to the device collection unit 18A and the device transport arm 17B takes charge of the transport from the test section 16 to the device collection unit 18B. Further, like the temperature adjustment section 12 and the device supply section 14, the device collection unit 18 is also grounded.

The IC device 90 tested by the test section 16 is placed in the collection tray 19, which is fixed so as not to move in the device collection area A4. In this way, the tested IC device 90 is stably placed on the collection tray 19 even in the device collection area A4 where a relatively large number of movable units such as the device transport arm 20 and the like are disposed. In the configuration shown in FIG. 2, three collection trays 19 are disposed in the X-axis direction.

Further, three empty trays 200 are also disposed in the X-axis direction. The IC device 90 tested by the test section 16 is also placed in the empty tray 200. Then, the IC device 90 on the device collection unit 18, moving to the device collection area A4, is transported to, either the collection tray 19 or the empty tray 200 and placed therein. In this way, the IC device 90 is sorted out according to each test result and collected.

The device transport arm 20 is supported to move in the X-axis direction or the Y-axis direction in the device collection area A4 and further has a portion also movable in the Z-axis direction. The device transport arm 20 is a part of the transporter 25 and can transport the IC device 90 from the device collection unit 18 to the collection tray 19 or the empty tray 200. The movement of the device transport arm 20 in the X-axis direction is denoted by the arrow α20X and the movement of the device transport arm 20 in the Y-axis direction is denoted by the arrow α20Y in FIG. 2.

The tray transport mechanism 21 transports the empty tray 200, transported from the tray removal area A5, in the X-axis direction, that is, in the arrow α21 direction in the device collection area A4. Then, after the transport, the empty tray 200 is disposed in the position where the IC device 90 is collected, that is, can be any one of the three empty trays 200.

The tray removal area A5 is a material removing section where the tray 200, in which a plurality of IC devices 90 in a tested state are disposed, is collected and removed. A large number of trays 200 can be stacked in the tray removal area A5.

Further, a tray transport mechanism 22A and a tray transport mechanism 22B transporting the tray 200 one by one in the Y-axis direction across the device collection area A4 and the tray removal area A5 are provided. The tray transport mechanism 22A is a part of the transporter 25 and can cause the tray 200 to reciprocate in the Y-axis direction, that is, in the arrow α22A direction. In this way, it is possible to transport the tested IC device 90 from the device collection area A4 to the tray removal area A5. Further, the tray transport mechanism 22B moves the empty tray 200 for collecting IC device 90 to the positive side in the Y-axis direction, that is, the arrow α22B direction. In this way, it is possible to transport the empty tray 200 from the tray removal area A5 to the device collection area A4.

The control section 800 can control operations of various sections such as the tray transport mechanism 11A, the tray transport mechanism 11B, the temperature adjustment section 12, the device transport arm 13, the device supply section 14, the tray transport mechanism 15, the test section 16, the device transport arm 17, the device collection unit 18, the device transport arm 20, the tray transport mechanism 21, the tray transport mechanism 22A, the tray transport mechanism 22B, and the like, for example. In the present embodiment, as shown in FIG. 2, the control section 800 has at least one processor 802 and at least one memory 803. The processor 802 can read a determination program, an instruction/command program and the like, for example, as various information stored in the memory 803 and execute a determination and an instruction.

Further, the control section 800 may be incorporated inside the electronic component tester 1 or may be provided in an external device such as an external computer or the like. The external device communicates with the electronic component tester 1 through a cable or a radio or is coupled to the electronic component tester 1 through a network such as an internet or the like, for example.

An operator operating the electronic component tester 1 can set or check the operating conditions and the like of the electronic component tester 1 through the monitor 300. The monitor 300 has a display screen 301 configured with a liquid crystal screen, for example, and is disposed in the front side upper portion of the electronic component tester 1. As shown in FIG. 1, a mouse stand 600 on which a mouse is placed is provided on the right side of the tray removal area A5 in the figure. This mouse is used when the screen displayed in the monitor 300 is operated.

Further, an operation panel 700 is disposed below the monitor 300 at the lower right in FIG. 1. The operation panel 700 commands the electronic component tester 1 to perform desired operation separately from the monitor 300.

Further, a signal lamp 400 can report operating state and the like of the electronic component tester 1 by the combination of the light emitting colors. The signal lamp 400 is disposed in an upper portion of the electronic component tester 1. A speaker 500 is incorporated in the electronic component tester 1, and the operating state of the electronic component tester 1 can also be reported by the speaker 500.

In the electronic component tester 1, the tray supply area A1 and the device supply area A2 are divided by a first partition wall 231, the device supply area A2 and the test area A3 are divided by a second partition wall 232, the test area A3 and the device collection area A4 are divided by a third partition wall 233, and the device collection area A4 and the tray removal area A5 are divided by a fourth partition wall 234. Further, the device supply area A2 and the device collection area A4 are also divided by a fifth partition wall 235.

The outermost part of the electronic component tester 1 is covered with a cover, and the cover includes a front cover 241, a side cover 242, a side cover 243, a rear cover 244, and a top cover 245, for example.

There is a concern that, in the electronic component tester 1, when the suction section 51 deteriorates over time, for example, the adsorption force F declines so that it is difficult to adsorb the IC device 90 sufficiently and the device transport arm 17 cannot transport the IC device 90, depending on the degree of deterioration.

The electronic component tester 1 is configured to execute an adsorption force test of testing a decline of the adsorption force F and eliminate such a concern. The adsorption force test will be described in the following.

The electronic component tester 1 is shipped in a state where the test section 16 is removed, that is, as the electronic component handler 10. The device transport arm 17 is shipped with a guarantee that the first pressure P1 in the first holding unit 4a does not fall below the threshold value P0 even if the first holding unit 4a, among the first holding unit 4a to the fourth holding unit 4d, is caused to adsorb the IC device 90 and the remaining second holding unit 4b to the fourth holding unit 4d are in an idle adsorption state.

Here, the "idle adsorption state" refers to a state where the second branch flow path 32 is opened by the second opening/closing section 42b in the second holding unit 4b while the suction section 51 is operated and the adsorption of the IC device 90 is possible but the IC device 90 is not adsorbed, for example. The same applies to the whole holding units from the first holding unit 4a to the fourth holding unit 4d.

Further, the "threshold value P0", preset and stored in the memory 803, is a pressure value, measured when the adsorption force F is obtained to such an extent that the adsorption of the IC device 90 is possible in the first holding unit 4a, inside the first branch flow path 31. The same applies to the whole holding units from the first holding unit 4a to the fourth holding unit 4d. It should be noted that the magnitude of the threshold value P0 can be appropriately changed and adjusted.

Then, there is a concern that, when the electronic component tester 1 continues to be used and the suction section 51 deteriorates over the years, the first pressure P1 in the first holding unit 4a falls below the threshold value P0 to deviate from the guarantee state if the first holding unit 4a is caused to adsorb the IC device 90 and at least one holding unit among the remaining second holding unit 4b to fourth holding unit 4d is in the idle adsorption state thereafter. In this case, there is a possibility that the adsorption force F declines and that the IC device 90 is detached from the first holding unit 4a.

Therefore, the adsorption force test is performed in the following manner.

Figure 3:
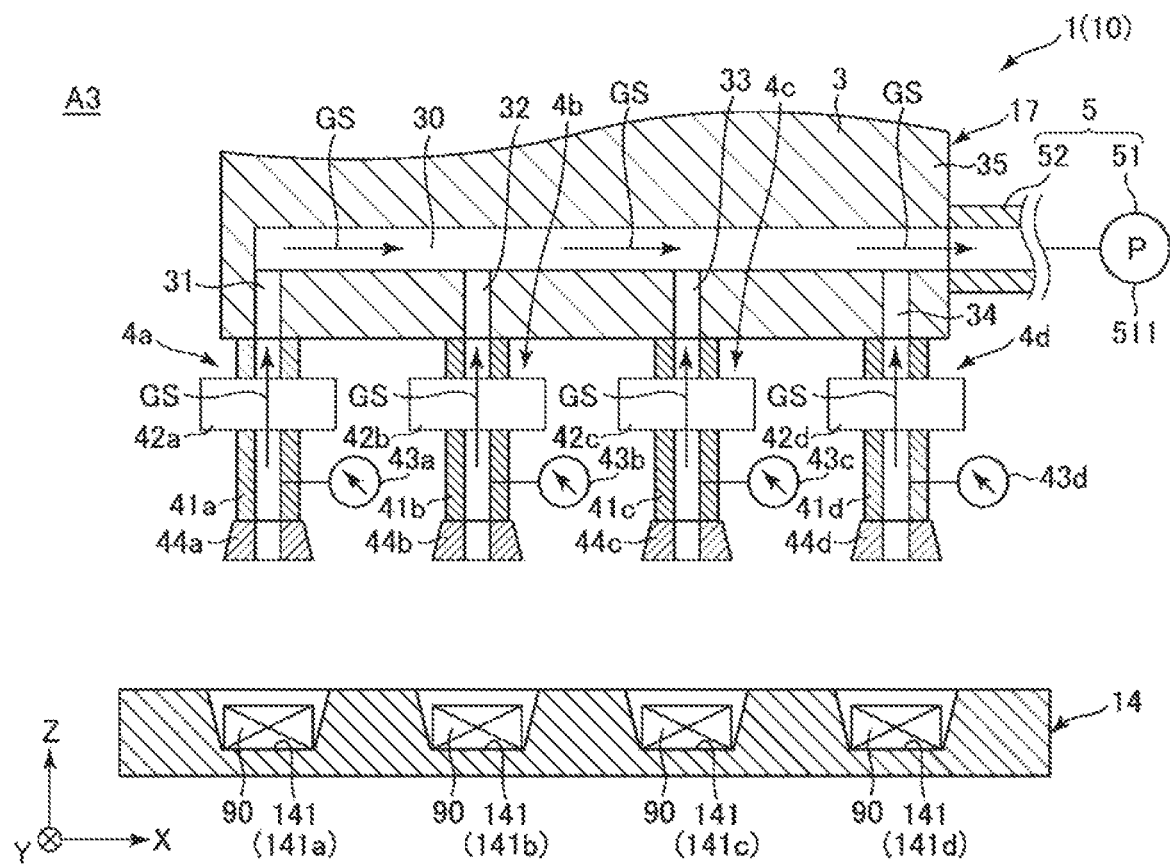
FIG. 3 is a vertical sectional view sequentially showing operation states of a device transport arm in a test area of the electronic component tester shown in FIG. 1.

First, as shown in FIG. 3, the device transport arm 17 is positioned above and away from the device supply section 14 and the first holding unit 4a to the fourth holding unit 4d are in the idle adsorption state. At this time, the processor 802 of the control section 800 checks whether or not any one of the first pressure P1, the second pressure P2, the third pressure P3, and the fourth pressure P4 is lower than the threshold value P0.

When any one of the first pressure P1 to the fourth pressure P4 falls below the threshold value P0, the processor 802 can determine that clogging does not occur inside the flow path formation section 35 and the first holding unit 4a to the fourth holding unit 4d. Contrary to this, when any one of the first pressure P1 to the fourth pressure P4 does not fall below the threshold value P0, it is possible to determine that clogging occurs in the holding unit of which the pressure does not fall below the threshold value P0. In this case, it is possible to report that clogging occurs in the holding unit through the monitor 300 or the like, for example. Further, the IC device 90 is placed in each recess 141 of the device supply section 14.

Figure 4:
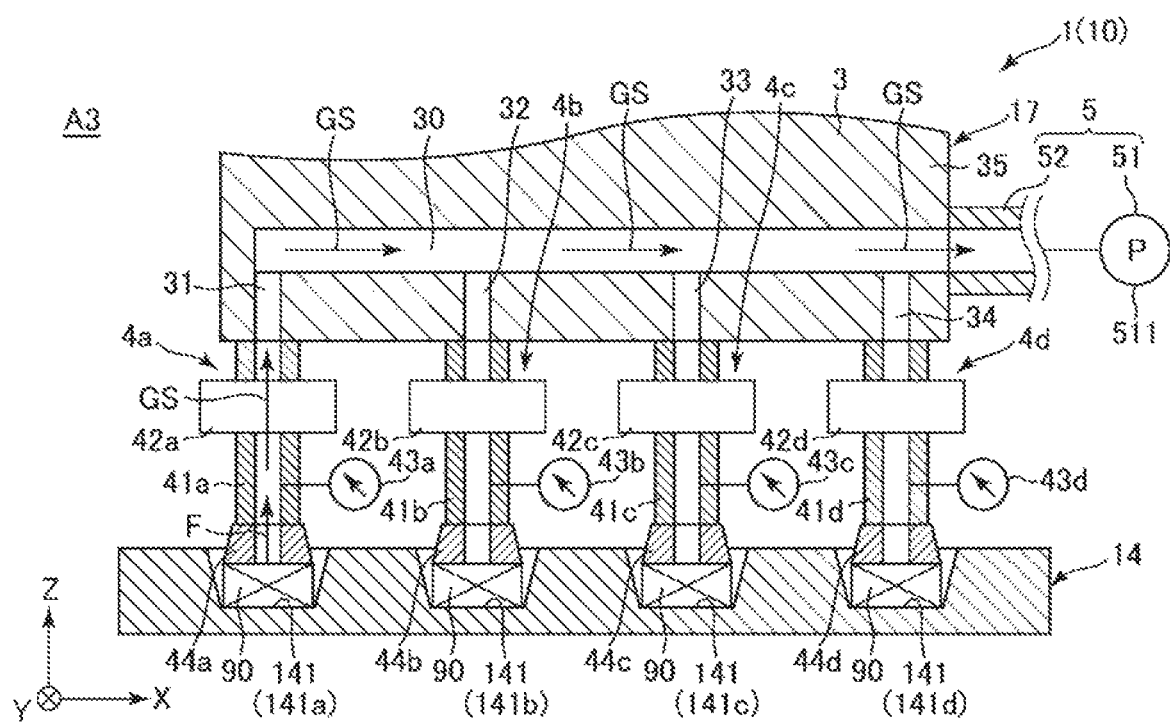
FIG. 4 is a vertical sectional view sequentially showing the operation states of the device transport arm in the test area of the electronic component tester shown in FIG. 1.

Then, the second opening/closing section 42b of the second holding unit 4b is operated to close the second branch flow path 32, the third opening/closing section 42c of the third holding unit 4c is operated to close the third branch flow path 33, the fourth opening/closing section 42d of the fourth holding unit 4d is operated to close the fourth branch flow path 34, and, as shown in FIG. 4, the device transport arm 17 is lowered. In this way, it is possible for the first holding unit 4a to adsorb the IC device 90 in the first recess 141a.

Figure 5:
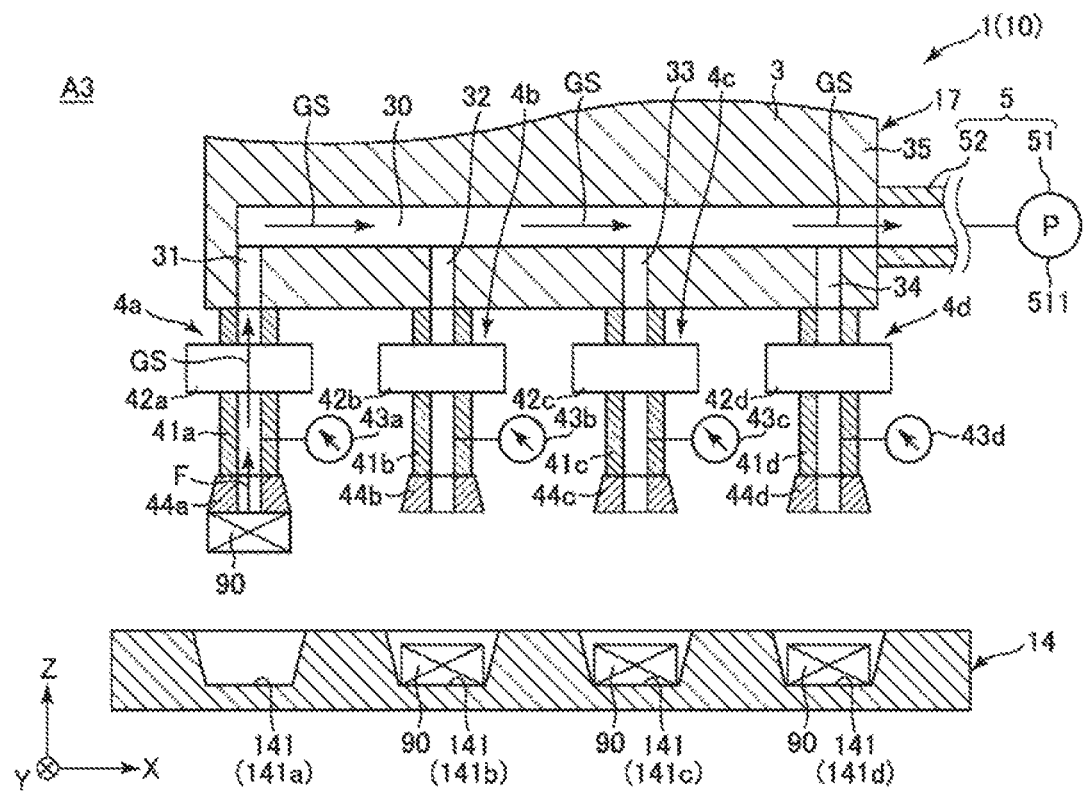
FIG. 5 is a vertical sectional view sequentially showing the operation states of the device transport arm in the test area of the electronic component tester shown in FIG. 1.

Then, as shown in FIG. 5, the device transport arm 17 is lifted to the same position as the position shown in FIG. 3. In this way, the device transport arm 17 can be separated from the device supply section 14 while the first holding unit 4a adsorbs the IC device 90.

Further, the IC device 90 remains in the second recess 141b, the third recess 141c, and the fourth recess 141d of the device supply section 14 respectively.

Figure 6:
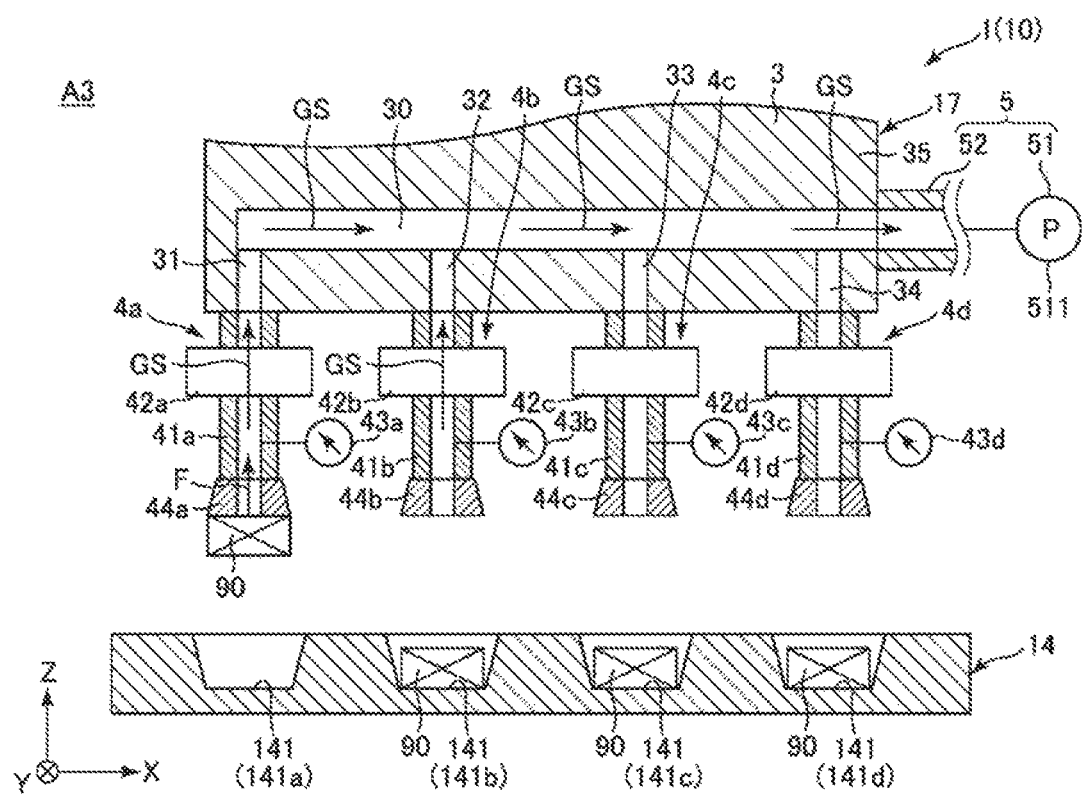
FIG. 6 is a vertical sectional view sequentially showing the operation states of the device transport arm in the test area of the electronic component tester shown in FIG. 1.

Then, as shown in FIG. 6, the second opening/closing section 42b of the second holding unit 4b is operated to open the second branch flow path 32. In this way, the second holding unit 4b transitions into an idle adsorption state. Further, at this time, the first pressure P1 of the first holding unit 4a changes and whether or not the first pressure P1 is yet lower than the threshold value P0 even after the change is checked. If the check result is "negative", the operation proceeds to the next operation, that is, to the state shown in FIG. 7.

Figure 7:
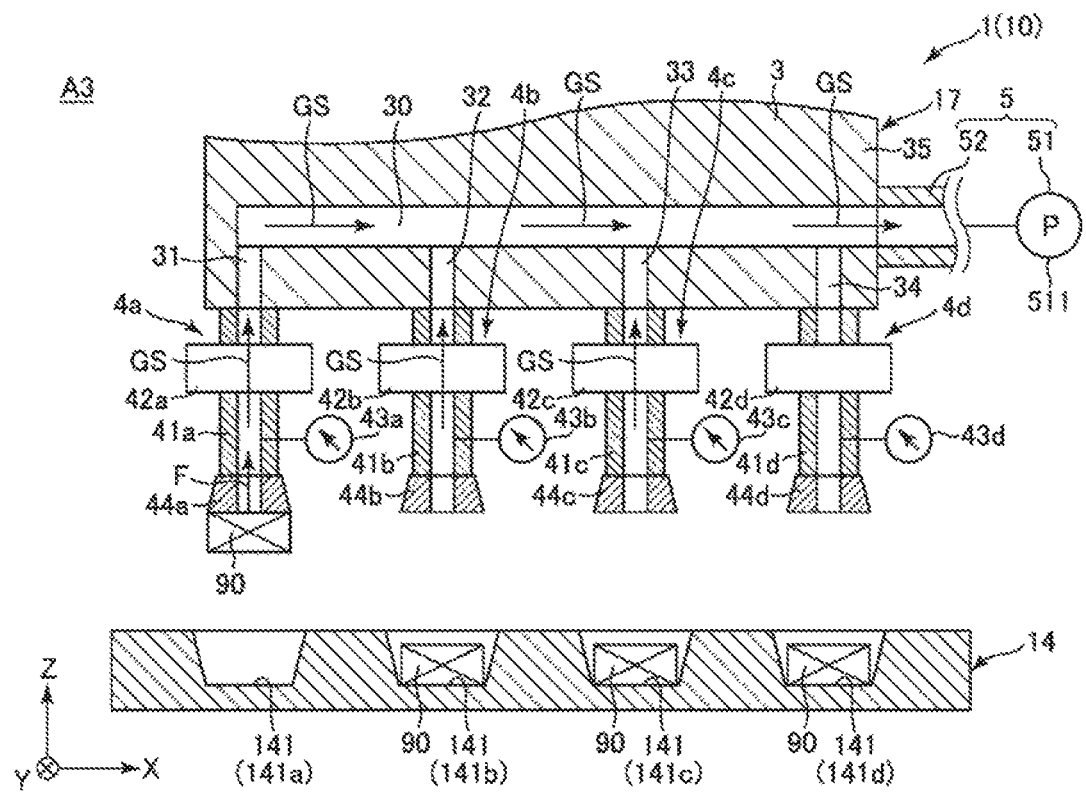
FIG. 7 is a vertical sectional view sequentially showing the operation states of the device transport arm in the test area of the electronic component tester shown in FIG. 1.

In the state shown in FIG. 7, the third opening/closing section 42c of the third holding unit 4c is operated to open the third branch flow path 33, while the idle adsorption state of the second holding unit 4b is maintained. In this way, the third holding unit 4c transitions into the idle adsorption state. Further, at this time, the first pressure P1 of the first holding unit 4a changes again and whether or not the first pressure P1 is yet lower than the threshold value P0 even after the change is checked. If the check result is "negative", the operation proceeds to the next operation, that is, to the state shown in FIG. 8.

Figure 8:
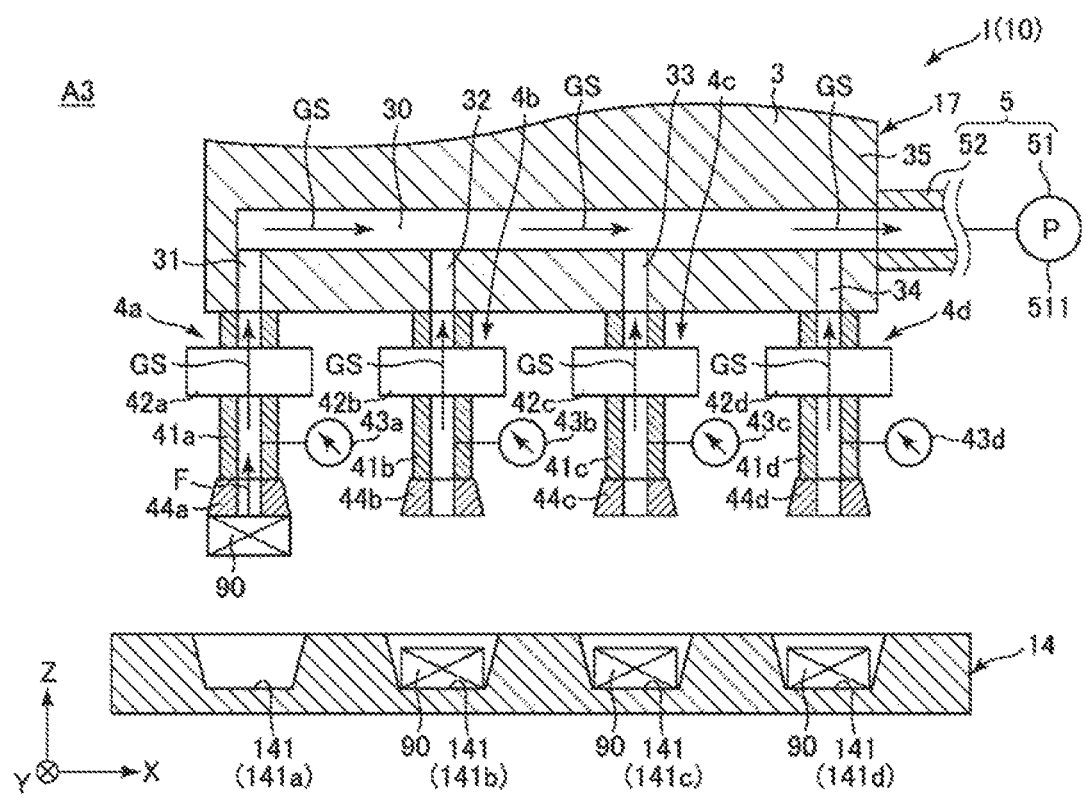
FIG. 8 is a vertical sectional view sequentially showing the operation states of the device transport arm in the test area of the electronic component tester shown in FIG. 1.

In the state shown in FIG. 8, the fourth opening/closing section 42d of the fourth holding unit 4d is operated to open the fourth branch flow path 34, while the idle adsorption state of the second holding unit 4b and the third holding unit 4c is maintained. In this way, the fourth holding unit 4d transitions into the idle adsorption state. Further, at this time, the first pressure P1 of the first holding unit 4a changes again and whether or not the first pressure P1 is yet lower than the threshold value P0 even after the change is checked. If the check result is "negative", operation proceeds to the next operation, that is, to the state shown in FIG. 9.

Figure 9:
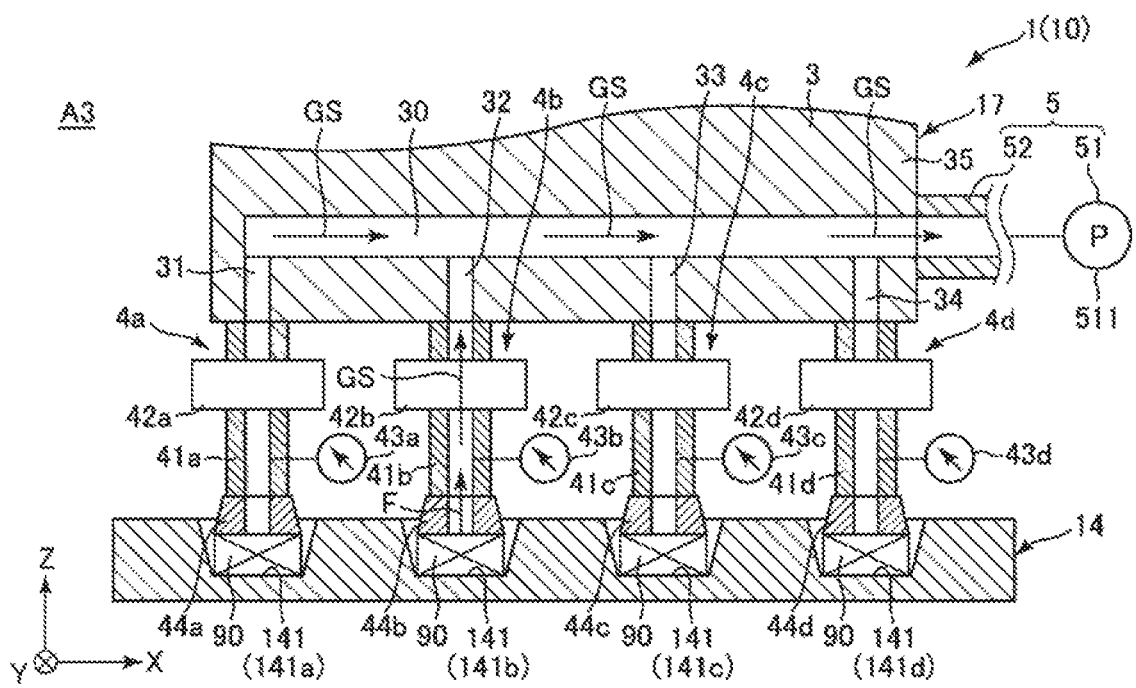
FIG. 9 is a vertical sectional view sequentially showing the operation states of the device transport arm in the test area of the electronic component tester shown in FIG. 1.

In the state shown in FIG. 9, the device transport arm 17 is lowered. At this time, since the second branch flow path 32 is in the open state as described above, the second holding unit 4b can adsorb the IC device 90 in the second recess 141b. Further, the first opening/closing section 42a of the first holding unit 4a is operated to close the first branch flow path 31, the third opening/closing section 42c of the third holding unit 4c is operated to close the third branch flow path 33, and the fourth opening/closing section 42d of the fourth holding unit 4d is operated to close the fourth branch flow path 34.

Figure 10:
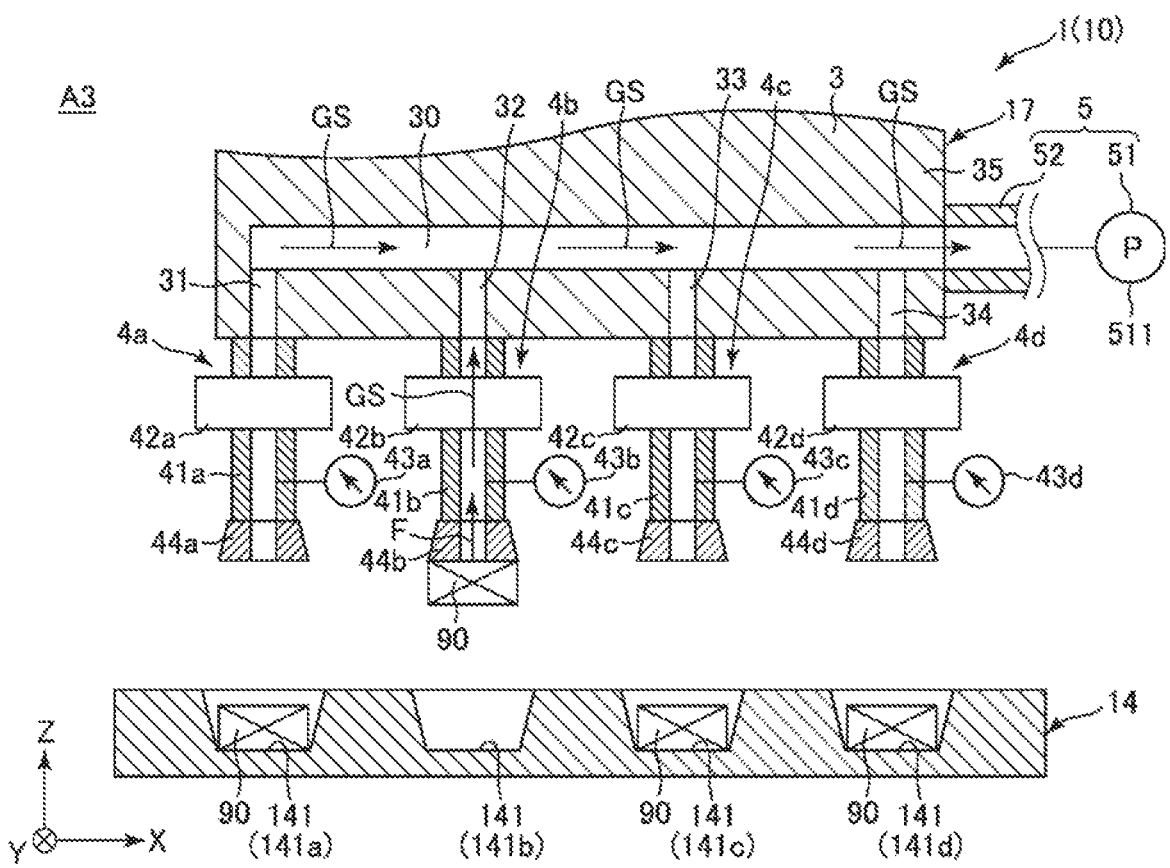
FIG. 10 is a vertical sectional view sequentially showing the operation states of the device transport arm in the test area of the electronic component tester shown in FIG. 1.

Then, as shown in FIG. 10, the device transport arm 17 is lifted to the same position as the position shown in FIG. 3. In this way, the device transport arm 17 can be separated from the device supply section 14 while the second holding unit 4b adsorbs the IC device 90.

Further, the IC device 90 remains in the first recess 141a, the third recess 141c, and the fourth recess 141d of the device supply section 14 respectively.

Figure 11:
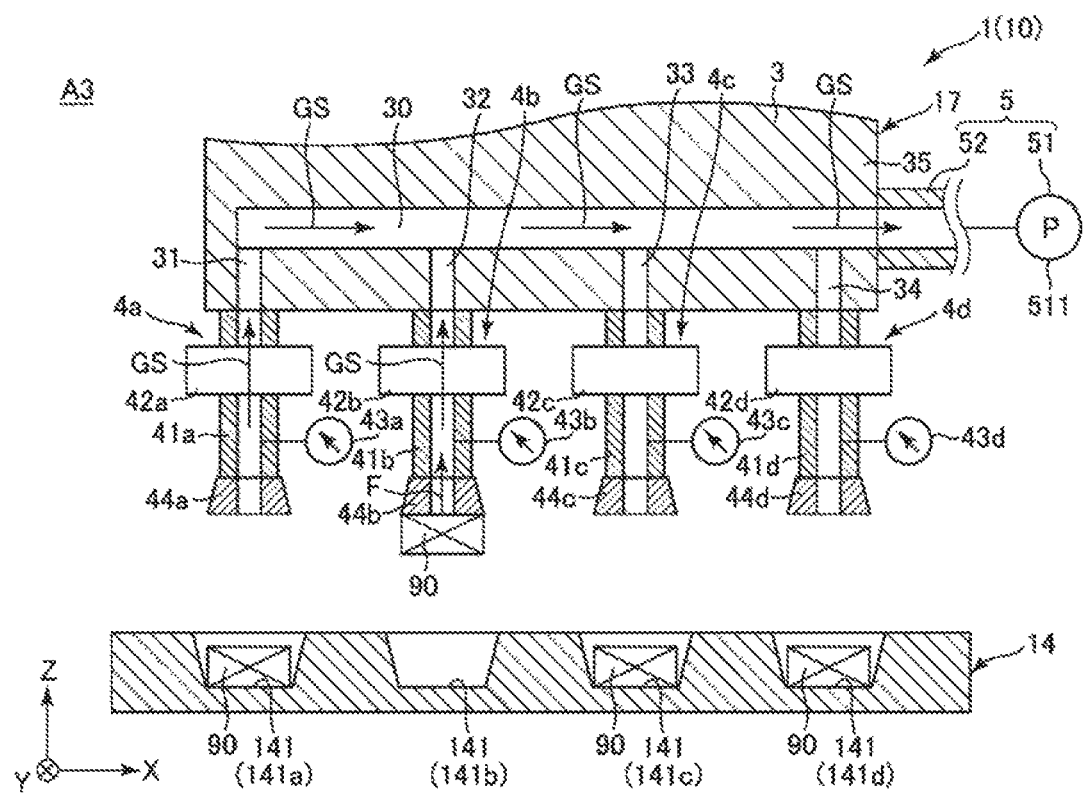
FIG. 11 is a vertical sectional view sequentially showing the operation states of the device transport arm in the test area of the electronic component tester shown in FIG. 1.

Then, as shown in FIG. 11, the first opening/closing section 42a of the first holding unit 4a is operated to open the first branch flow path 31. In this way, the first holding unit 4a transitions into the idle adsorption state. Further, at this time, the second pressure P2 of the second holding unit 4b changes and whether or not the second pressure P2 is yet lower than the threshold value P0 even after the change is checked. If the check result is "negative", operation proceeds to the next operation, that is, to the state shown in FIG. 12.

Figure 12:
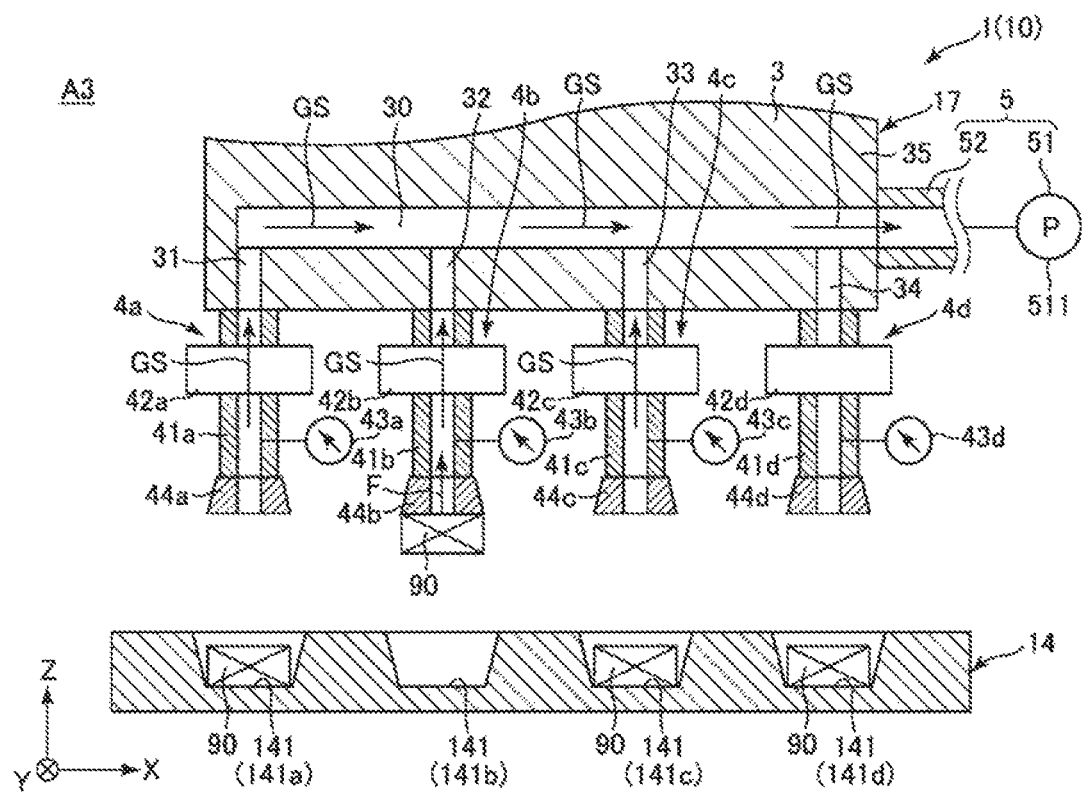
FIG. 12 is a vertical sectional view sequentially showing the operation states of the device transport arm in the test area of the electronic component tester shown in FIG. 1.

In the state shown in FIG. 12, the third opening/closing section 42c of the third holding unit 4c is operated to open the third branch flow path 33, while the idle adsorption state of the first holding unit 4a is maintained. In this way, the third holding unit 4c transitions into the idle adsorption state. Further, at this time, the second pressure P2 of the second holding unit 4b changes again and whether or not the second pressure P2 is yet lower than the threshold value P0 even after the change is checked. If the check result is "negative", operation proceeds to the next operation, that is, to the state shown in FIG. 13.

Figure 13:
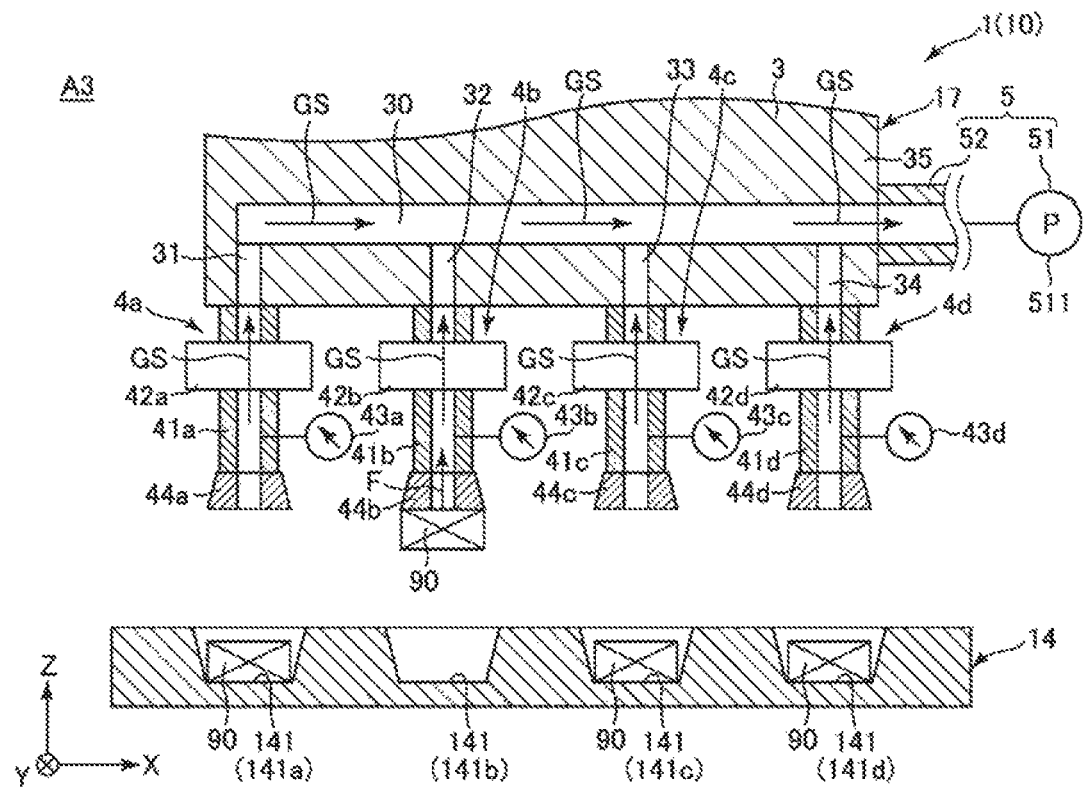
FIG. 13 is a vertical sectional view sequentially showing the operation states of the device transport arm in the test area of the electronic component tester shown in FIG. 1.

In the state shown in FIG. 13, the fourth opening/closing section 42d of the fourth holding unit 4d is operated to open the fourth branch flow path 34, while the idle adsorption state of the first holding unit 4a and the third holding unit 4c is maintained. In this way, the fourth holding unit 4d transitions to the idle adsorption state. Further, at this time, the second pressure P2 of the second holding unit 4b changes again and whether or not the second pressure P2 is yet lower than threshold value P0 even after the change is checked. If the check result is "negative", operation proceeds to the next operation, to the state shown in FIG. 14.

Figure 14:
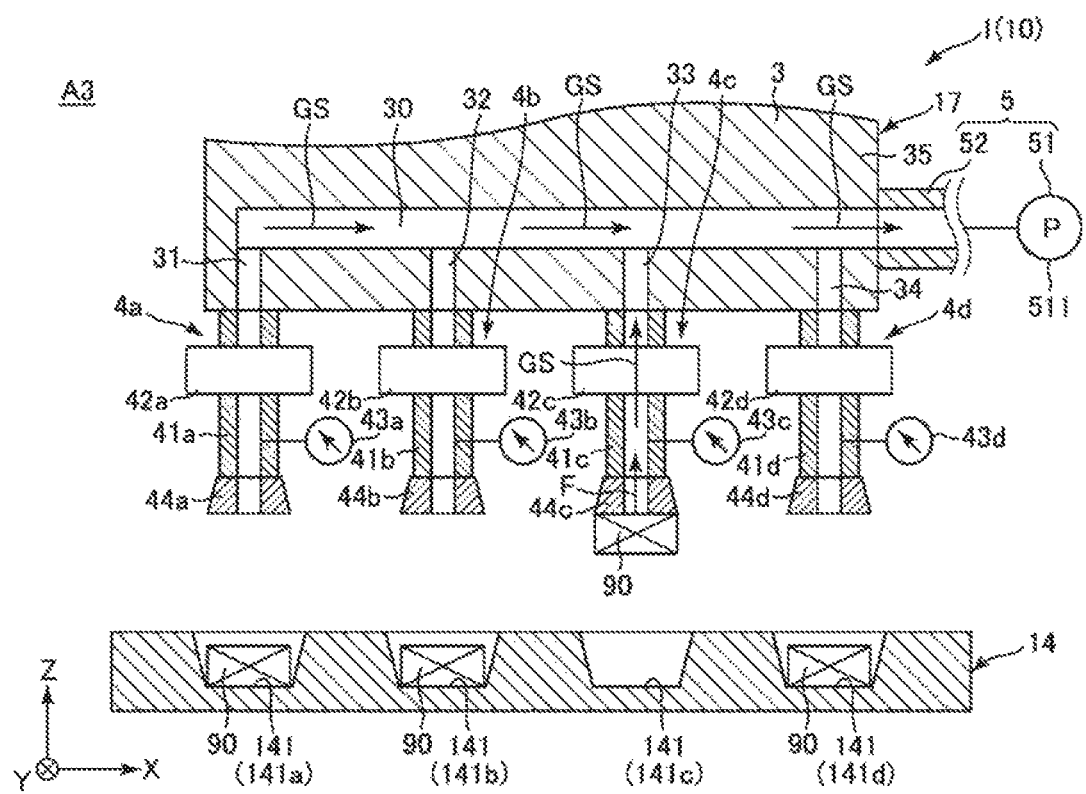
FIG. 14 is a vertical sectional view sequentially showing the operation states of the device transport arm in the test area of the electronic component tester shown in FIG. 1.

In the state shown in FIG. 14, the device transport arm 17 is lifted to the same position as the position shown in FIG. 3 and is separated from the device supply section 14. Further, the third holding unit 4c of the device transport arm 17 is adsorbing the IC device 90 placed in the third recess 141c of the device supply section 14. Such a state can be obtained by the same operation as the operation of causing the first holding unit 4a and the second holding unit 4b to adsorb the IC devices 90 as described above.

Further, in the state shown in FIG. 14, the first opening/closing section 42a of the first holding unit 4a is operated to close the first branch flow path 31, the second opening/closing section 42b of the second holding unit 4b is operated to close the second branch flow path 32, and the fourth opening/closing section 42d of the fourth holding unit 4d is operated to close the fourth branch flow path 34.

From such a state shown in FIG. 14, the first holding unit 4a, the second holding unit 4b, and the fourth holding unit 4d sequentially transition into the idle adsorption state in the same manner as described above. Whether or not the third pressure P3 of the third holding unit 4c is lower than the threshold value P0 is checked at each time.

Figure 15:
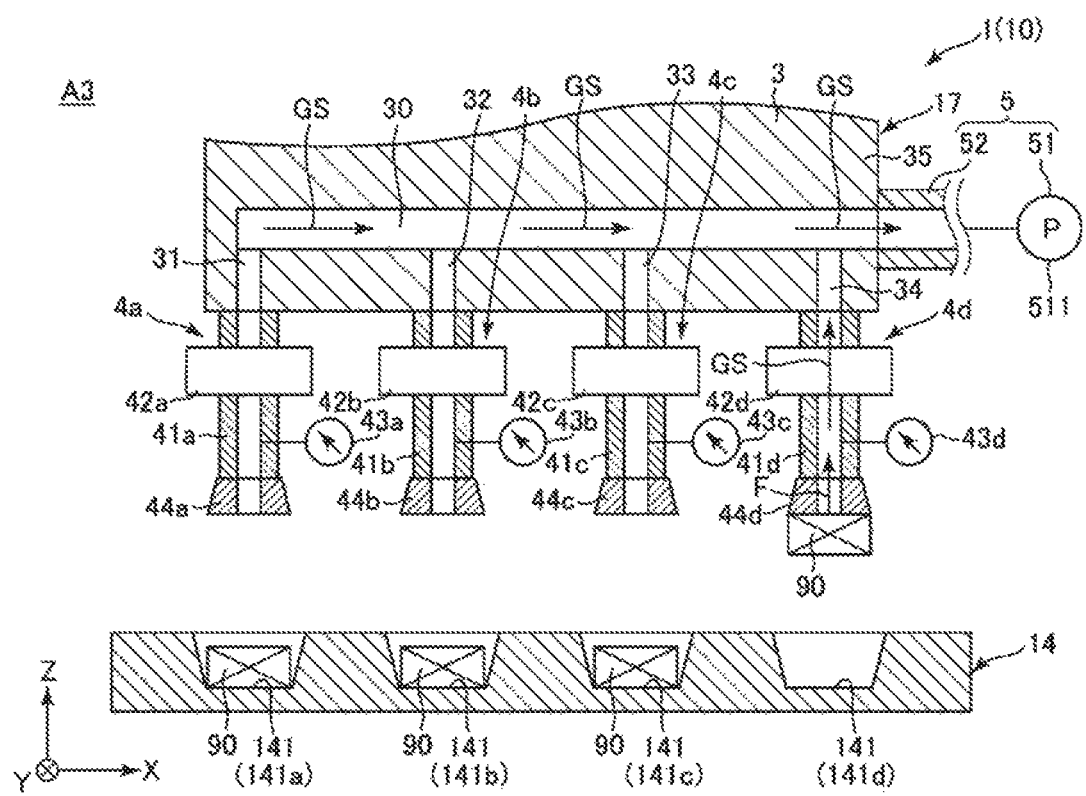
FIG. 15 is a vertical sectional view sequentially showing the operation states of the device transport arm in the test area of the electronic component tester shown in FIG. 1.

Next, the state is shown in FIG. 15. In the state shown in FIG. 15, the device transport arm 17 is lifted to the same position as the position shown in FIG. 3 and is separated from the device supply section 14. Further, the fourth holding unit 4d of the device transport arm 17 is adsorbing the IC device 90 placed in the fourth recess 141d of the device supply section 14.

Such a state can be obtained by the same operation as the operation of causing the first holding unit 4a and the second holding unit 4b to adsorb the IC device 90 as described above.

Further, in the state shown in FIG. 15, the first opening/closing section 42a of the first holding unit 4a is operated to close the first branch flow path 31, the second opening/closing section 42b of the second holding unit 4b is operated to close the second branch flow path 32, and the third opening/closing section 42c of the third holding unit 4c is operated to close the third branch flow path 33.

From such a state shown in FIG. 15, the first holding unit 4a, the second holding unit 4b, and the third holding unit 4c sequentially transition into the idle adsorption state in the same manner as described above. Whether or not the fourth pressure P4 of the fourth holding unit 4d is lower than the threshold value P0 is checked at each time.

Then, when the first pressure P1 is not lower than the threshold value P0 is checked regardless of the presence or absence of the idle adsorption state, the second pressure P2 is not lower than the threshold value P0 is checked regardless of the presence or absence of the idle adsorption state, the third pressure P3 is not lower than the threshold value P0 is checked regardless of the presence or absence of the idle adsorption state, and the fourth pressure P4 is not lower than the threshold value P0 is checked regardless of the presence or absence of the idle adsorption state, the processor 802 of the control section 800 can determine that a decline of the adsorption force F is not occurring.

On the other hand, when at least one of the first pressure P1 to the fourth pressure P4 is lower than the threshold value P0 in the process of sequential transitioning into the idle adsorption state as described above, the processor 802 of the control section 800 can determine that a decline of the adsorption force F is occurring.

Further, depending on how many holding units are in the idle adsorption state when the first pressure P1 is lower than the threshold value P0, for example, it is possible to determine the degree of the decline of the adsorption force F, that is, whether the decline of the adsorption force F is steep or gradual. This is the same for the first pressure P1 to the fourth pressure P4.

For example, the total number of the holding units in the idle adsorption state when the first pressure P1 is lower than the threshold value P0 is stored in the memory 803. The decline of the adsorption force F can be determined to be gradual when the total number exceeds a first ratio, and the decline of the adsorption force F can be determined to be steep when the total number exceeds a second ratio, which is higher than the first ratio.

The total number of the holding units excluding the holding units adsorbing the IC device 90 is set to be a whole number, and the ratio of the total number of the holding units in the idle adsorption state to the whole number is compared with the first ratio and the second ratio. That is, (total number of holding units in the idle adsorption state)/(whole number) is compared with the first ratio and the second ratio.

The first ratio is not particularly limited. The first ratio is preferably 40% or more and 80% or less and is more preferably 50% or more and 80% or less, for example. Further, when the decline of the adsorption force F is determined to be gradual, it is preferable to report that "the deterioration of the suction section 51 is in progress and it is preferable to consider replacement of the suction section 51" through the monitor 300 or the like, for example.

Further, the second ratio is not particularly limited. The second ratio is preferably 70% or more and is more preferably 80% or more. Further, when the decline of the adsorption force F is determined to be steep, it is preferable to report that "prompt replacement of the suction section 51 is urged" through the monitor 300.

Further, the determination may be made by focusing on one pressure among the first pressure P1 to the fourth pressure P4 or by focusing on all the pressures from the first pressure P1 to the fourth pressure P4. When the determination is made by focusing on all the pressures from the first pressure P1 to the fourth pressure P4, the determination may be made based on an average of the total number of holding units in the idle adsorption state when the pressure is lower than the threshold value P0, that is, an average value of (total number of the holding units in the idle adsorption state)/(whole number), or the determination may be made based on the largest total number of holding units in the idle state when the pressure is lower than the threshold value P0.

Further, in checking whether or not the first pressure P1 is lower than the threshold value P0 in a state where the first holding unit 4a adsorbs the IC device 90, the second holding unit 4b to the fourth holding unit 4d are set into the idle adsorption state as described above, and the present disclosure is not limited thereto. For example, when the second holding unit 4b transitions into the idle adsorption state in the middle of sequential transitioning of the second holding unit 4b to the fourth holding unit 4d into the idle adsorption state, the operation of setting the third holding unit 4c and the fourth holding unit 4d into the idle adsorption state can be omitted when the first pressure P1 is lower than the threshold value P0. This applies to the adsorption state of the IC device 90 of the first holding unit 4a to the fourth holding unit 4d.

As described above, when the adsorption force test is performed, first, the processor 802 of the control section 800 opens the first branch flow path 31 by the first opening/closing section 42a and causes the first holding section 41a to adsorb the IC device 90. Further, while in this adsorption state, sequentially the second branch flow path 32 is opened by the second opening/closing section 42b to be in the idle adsorption state, the third branch flow path 33 is opened by the third opening/closing section 42c to be in the idle adsorption state, and the fourth branch flow path 34 is opened by the fourth opening/closing section 42d to be in the idle adsorption state. Then, whether or not the first pressure P1 at this time is lower than a preset pressure value, that is, the threshold value P0, is checked. In this way, this check result can be used in determining the degree of the decline of the adsorption force F as described above.

Then, the processor 802 of the control section 800 opens the second branch flow path 32 by the second opening/closing section 42b and causes the second holding section 41b to adsorb the IC device 90. Further, while in this adsorption state, sequentially the first branch flow path 31 is opened by the first opening/closing section 42a to be in the idle adsorption state, the third branch flow path 33 is opened by the third opening/closing section 42c to be in the idle adsorption state, and the fourth branch flow path 34 is opened by the fourth opening/closing section 42d to be in the idle adsorption state. Then, whether or not the second pressure P2 at this time is lower than the threshold value P0 is checked. In this way, this check result can be used in determining the degree of the decline of the adsorption force F as described above.

Then, the processor 802 of the control section 800 opens the third branch flow path 33 of the third opening/closing section 42c and causes the second holding section 41b to adsorb the IC device 90. Then, while in this adsorption state, sequentially the first branch flow path 31 is opened by the first opening/closing section 42a to be in the idle adsorption state, the second branch flow path 32 is opened by the second opening/closing section 42b to be in the idle adsorption state, and the fourth branch flow path 34 is opened by the fourth opening/closing section 42d to be in the idle adsorption state. Then, whether or not the third pressure P3 at this time is lower than the threshold value P0 is checked. In this way, this check result can be used in determining the degree of the decline of the adsorption force F as described above.

Then, the processor 802 of the control section 800 opens the fourth branch flow path 34 of the fourth opening/closing section 42d and causes the fourth holding section 41d to adsorb the IC device 90. Then, while in this adsorption state, sequentially the first branch flow path 31 is opened by the first opening/closing section 42a to be in the idle adsorption state, the second branch flow path 32 is opened by the second opening/closing section 42b to be in the idle adsorption state, and the third branch flow path 33 is opened by the third opening/closing section 42c to be in the idle adsorption state. Then, whether or not the fourth pressure P4 at this time is lower than the threshold value P0 is checked. In this way, this check result can be used in determining the degree of the decline of the adsorption force F as described above.

As described above, in the electronic component tester 1, it is possible to detect the decline of the adsorption force F by the software alone.

Further, in the adsorption force test, when the pressure of only a particular holding unit among the first holding unit 4a to the fourth holding unit 4d is always lower than the threshold value P0, it is possible to detect an adjustment failure of the threshold value P0.

Further, as described above, when the first pressure P1 is lower than the threshold value P0, the second pressure P2 is lower than the threshold value P0, the third pressure P3 is lower than the threshold value P0, and the fourth pressure P4 is lower than the threshold value P0, the processor 802 of the control section 800 can determine that the decline of the adsorption force F occurs. In this way, it is possible to prevent the adsorption force F from declining and from making it difficult to adsorb the IC device 90. Further, if the suction section 51 is replaced with a new suction section 51, it is possible to stably perform the transport of the IC device 90 by the device transport arm 17.

Further, examples of the timing for performing the adsorption force test are as follows.

A first timing is immediately before starting the test of the IC device 90 by activating the electronic component tester 1.

A second timing is when the type of the IC device 90 to be tested by the electronic component tester 1 is changed, that is, at the time of product type switching.

A third timing is when a predetermined time elapsed. In this case, the adsorption force test can be performed once after 24 hours or once after one week, for example.

A fourth timing is when a predetermined time has passed since the previous deterioration test.

A fifth timing is when "dropping of the IC device 90 by the device transport arm 17" occurs as a jam occurs.

A sixth timing is when performance is forced regardless of the first to fifth timings.

It is preferable that the first to sixth timings can be appropriately selected and set in the electronic component tester 1.

The electronic component tester 1 includes the monitor 300, the signal lamp 400, and the speaker 500 as a report section reporting a determination result of the control section 800 in the adsorption force test. In this way, the operator can check the determination result of the control section 800. For example, when the monitor 300 is used as the report section, the operator can check the determination result of the control section 800 on the display screen 301. In this case, it is preferable that the information of the holding unit of which the pressure is lower than the threshold value P0 is also displayed on the display screen 301. Further, when the signal lamp 400 is used as the report section, the operator can check the determination result of the control section 800 by the combination of the light emitting colors. Further, when the speaker 500 is used as the report section, the operator can check the determination result of the control section 800 by voice.

The electronic component tester 1 may be configured to report the determination result of the control section 800 in the adsorption force test to the user using the electronic component tester 1 and the person maintaining the electronic component tester 1. Further, the electronic component tester 1 may store the determination result in a server of the user using the electronic component tester 1.

Figure 16:
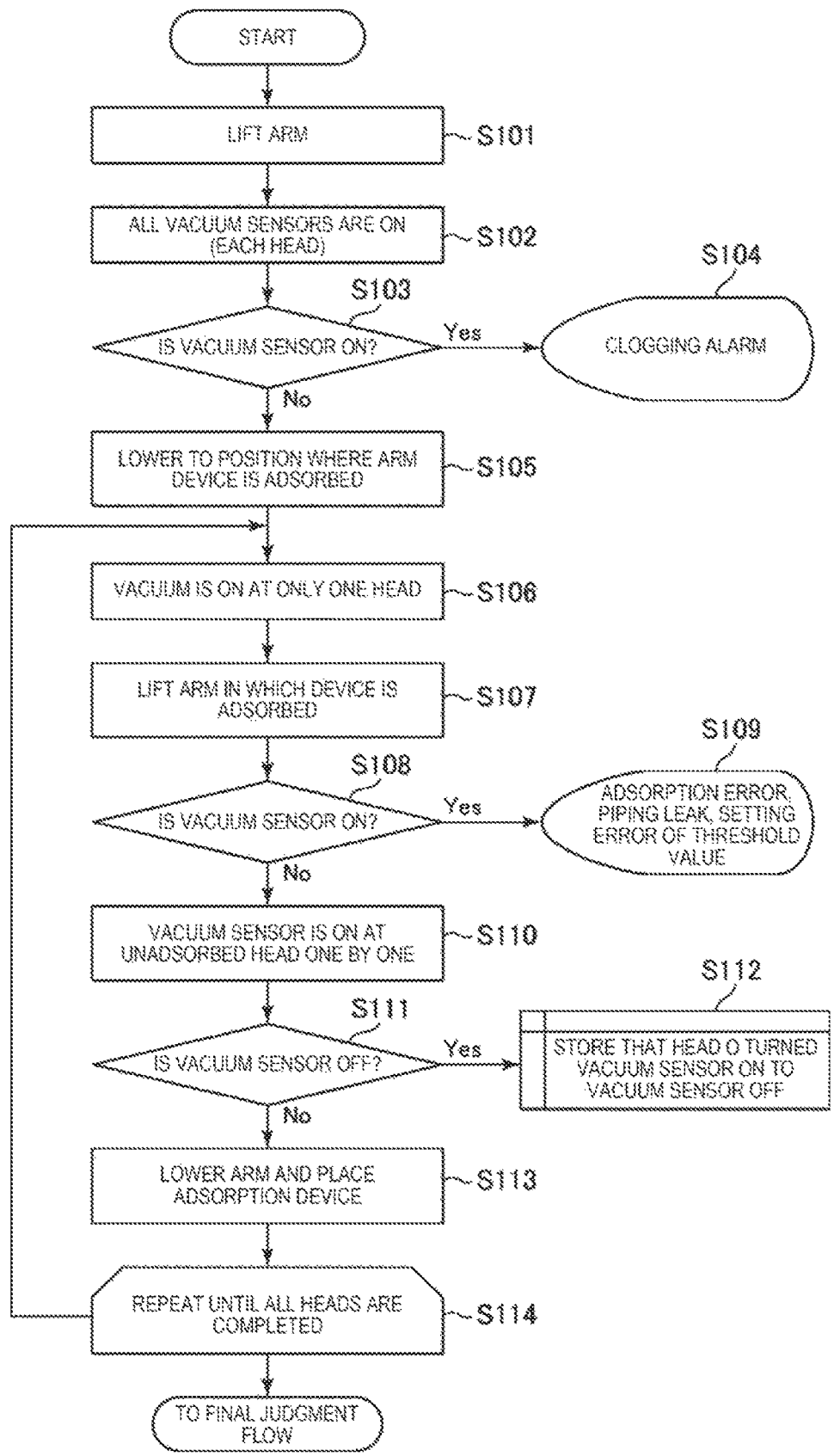
FIG. 16 is a flowchart for describing a control operation of a control section included in the electronic component tester shown in FIG. 1.
Figure 17:
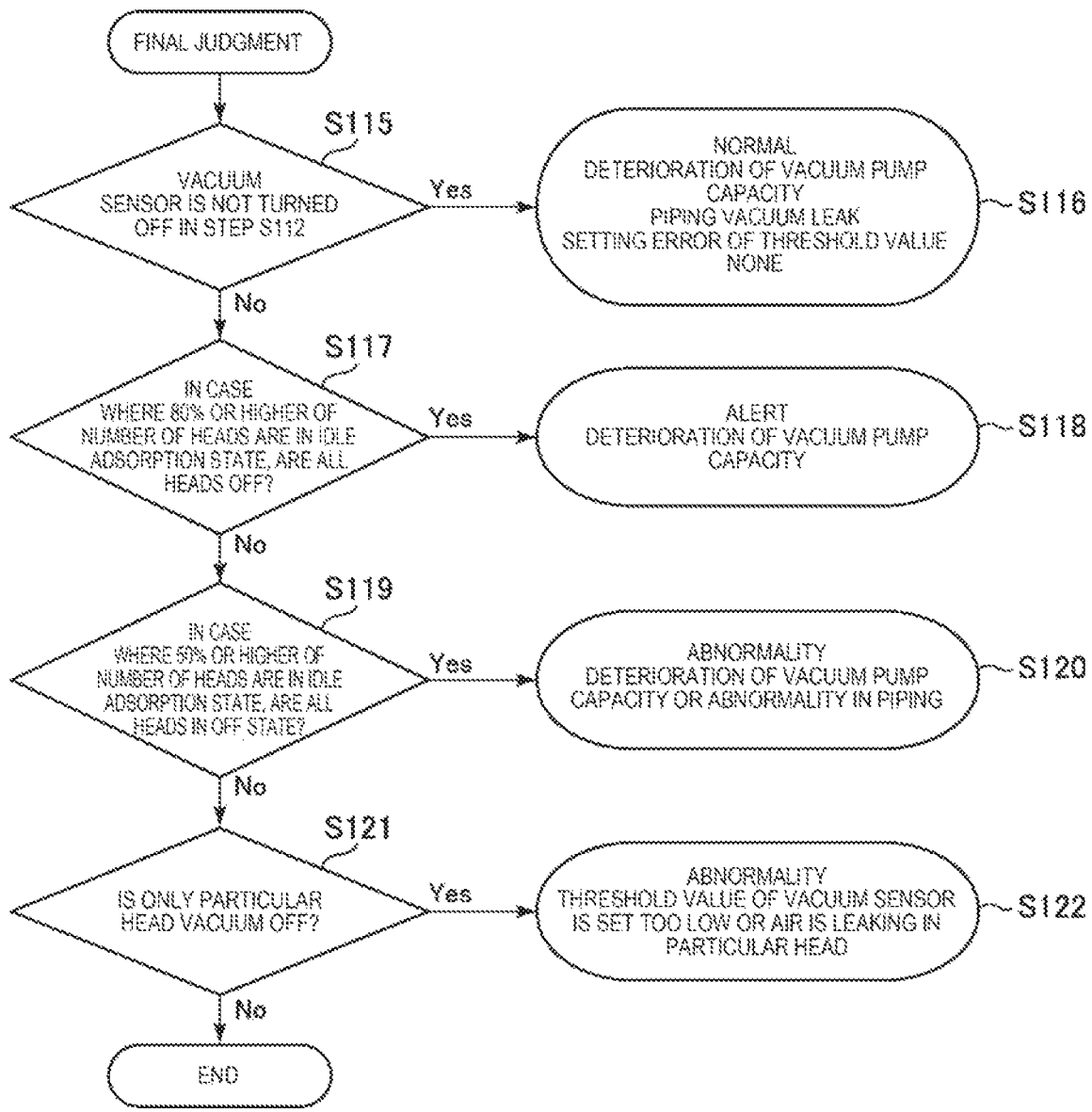
FIG. 17 is a flowchart for describing a control operation of the control section included in the electronic component tester shown in FIG. 1.

Then, a control program of the control section 800 when the adsorption force test is executed will be described based on the flowcharts in FIGS. 16 and 17.

First, the device transport arm 17 is lifted to be positioned above the device supply section 14 (step S101). At this time, the first opening/closing section 42a of the first holding unit 4a, the second opening/closing section 42b of the second holding unit 4b, the third opening/closing section 42c of the third holding unit 4c, and the fourth opening/closing section 42d of the fourth holding unit 4d are all closed. Further, the IC device 90 is placed in each recess 141 of the device supply section 14.

Then, the first opening/closing section 42a of the first holding unit 4a is opened, the second opening/closing section 42b of the second holding unit 4b is opened, the third opening/closing section 42c of the third holding unit 4c is opened, and the fourth opening/closing section 42d of the fourth holding unit 4d is opened in order (step S102).

Then, whether or not the first pressure P1 of the first holding unit 4a, the second pressure P2 of the second holding unit 4b, the third pressure P3 of the third holding unit 4c, and the fourth pressure P4 of the fourth holding unit 4d are all equal to or higher than the threshold value P0, that is, whether or not a signal indicating that each vacuum sensor is ON is received, is determined (step S103).

If the signal indicating that each vacuum sensor is ON is received in step S103, a "clogging alarm" is issued (step S104).

On the other hand, when the signal indicating that each vacuum sensor is ON is not received in step S103, the device transport arm 17 is lowered to a position where the IC device 90 on the device supply section 14 can be adsorbed (step S105).

Then, the first holding unit 4a is caused to adsorb the IC device 90 (step S106), and the device transport arm 17 is lifted as it is to be positioned above the device supply section 14 (step S107).

Then, whether or not a signal indicating that the vacuum sensor of the first holding unit 4a is ON is received is determined (step S108).

When a signal indicating that the vacuum sensor is ON is received in step S108, "adsorption error, piping leak, setting error of threshold value P0" is reported (step S109).

On the other hand, when a signal indicating that the vacuum sensor is ON is not received in step S108, the second holding unit 4b to the fourth holding unit 4d are sequentially set into the idle adsorption state (step S110).

Then, whether or not the first pressure P1 of the first holding unit 4a is lower than the threshold value P0, that is, whether or not a signal indicating that the vacuum sensor of the first holding unit 4a is OFF is received, is determined (step S111).

If a signal indicating that the vacuum sensor of the first holding unit 4a is OFF is received in step S111, which holding unit among the second holding unit 4b to the fourth holding unit 4d is in the idle adsorption state when the signal indicating that the vacuum sensor of the first holding unit 4a is OFF is received, that is, the number of the holding units in the idle adsorption state, is stored in the memory 803 (step S112).

Then, the device transport arm 17 is lowered, and the first holding unit 4a places the IC device 90 which is on the device supply section 14 (step S113).

Then, the same operation as in the first holding unit 4a is repeated for the second holding unit 4b to the fourth holding unit 4d (step S114).

Then, whether the vacuum sensor is not turned OFF in the step S112 is stored or not is determined (step S115).

When the determination result in the step S115 is that the vacuum sensor is not turned OFF, judgment is that" there is no deterioration of the suction section 51, no piping leak, and no setting error of the threshold value of P0" and that the operation is normal (step S116).

On the other hand, when the determination result in the step S115 is that the vacuum sensor is OFF, whether or not the second ratio is 80% or higher is determined (step S117).

When the determination result in the step S117 is that the second ratio is 80% or higher, the judgment is that "there is a deterioration of the suction section 51" and an alert is issued (step S118).

On the other hand, when the determination result in the step S117 is that the second ratio is not 80% or higher, whether or not the first ratio is 50% or higher is determined (step S119).

When the determination result in the step S119 is that the first ratio is 50% or higher, the judgment is that "there is a deterioration of the suction section 51 or there is an abnormality in the piping" and an abnormality is issued (step S120).

On the other hand, when the determination result in the step S119 is that the first ratio is not 50% or higher, whether or not a signal indicating that the vacuum sensor of a particular holding unit among the first holding unit 4a to the fourth holding unit 4d is OFF is received a plurality of times is determined (step S121).

When the determination result in the step S121 is that a signal indicating that the vacuum sensor of a particular holding unit is OFF is received a plurality of times, the judgment is that "the threshold value P0 is set too low or the air is leaking in the particular holding unit" and an abnormality is issued (step S122).

On the other hand, when the determination result in the step S121 is that the vacuum sensor of a particular holding unit is not OFF, the control program is terminated as it is.

It should be noted that the control program may not perform the steps S112 and S115 to S122.

For example, in the step S111, when the first pressure P1 of the first holding unit 4a is lower than the threshold value P0, that is, the vacuum sensor of the first holding unit 4a outputs an OFF signal, the control section 800 receiving the signal may issue an alert or an abnormality by the report section and terminate the control program as it is. Of course, in this case, when the first pressure P1 of the first holding unit 4a is not lower than the threshold value P0, that is, the vacuum sensor of the first holding unit 4a outputs an ON signal in the step S111, the control section 800 receiving the signal does not issue an alert or an abnormality by the report section and terminates the control program as it is.

Further, in the step S111, after an alert or an abnormality is issued as described above, the steps S113 and S114 are performed without termination as it is, and the same alert or abnormality as in the first holding unit 4a is also issued for the second holding unit 4b to the fourth holding unit 4d, and thereafter the control program may be terminated.

In these cases, it is possible to issue an alert or an abnormality early.

Then, an example of setting screen 26 on which the adsorption force test is set will be described with reference to FIG. 18. It is preferable that the setting screen 26 is displayed on the display screen 301 of the monitor 300.

Figure 18:
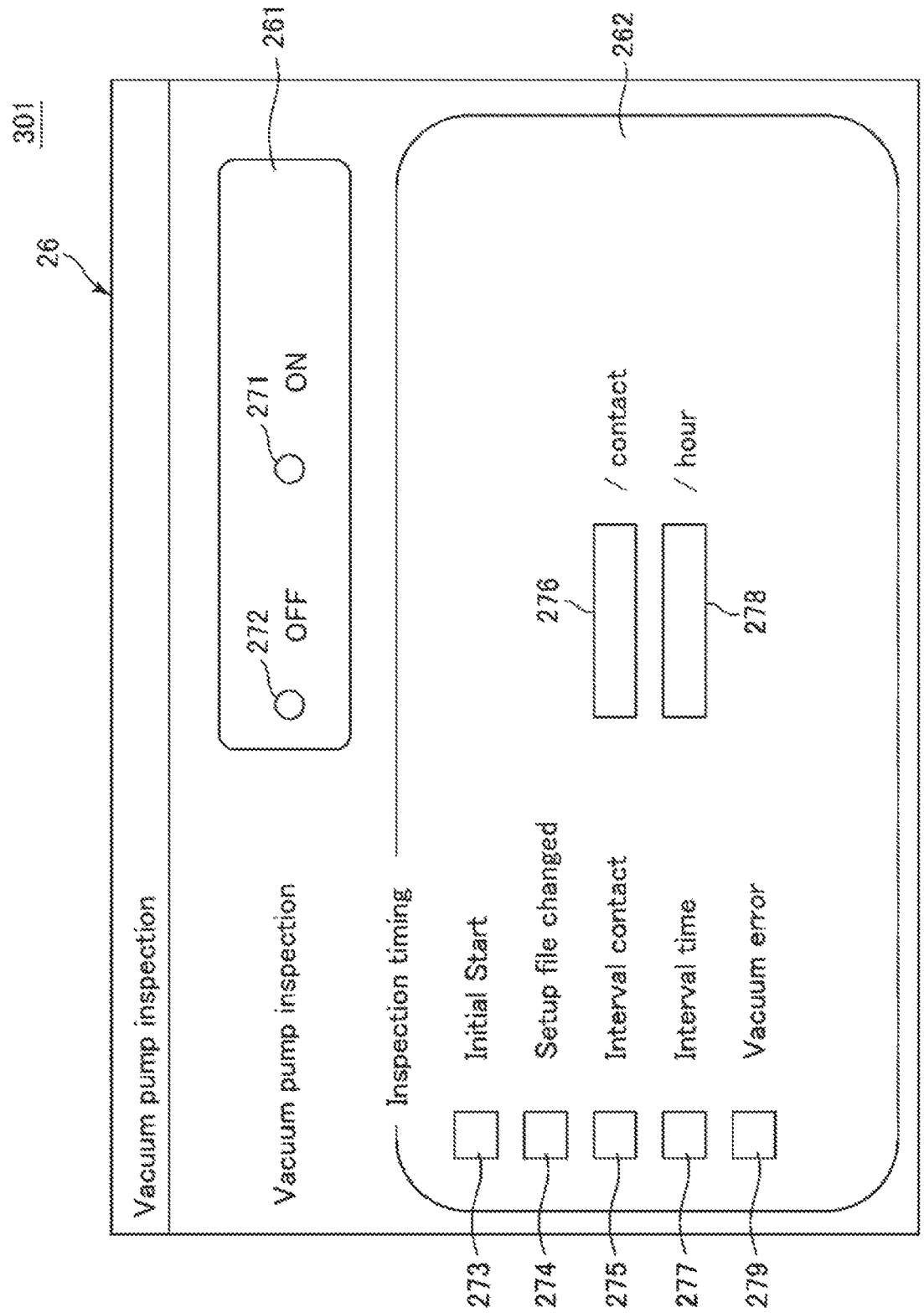
FIG. 18 is an example of a setting screen displayed on a monitor included in the electronic component tester shown in FIG. 1.

As shown in FIG. 18, the setting screen 26 includes a first selection section 261 for selecting the validity/invalidity of the execution of the adsorption force test and a second selection section 262 for selecting the timing of performing the adsorption force test.

The first selection section 261 includes a checkbox 271 for "validating" the execution of the adsorption force test and a checkbox 272 "for invalidating" the execution of the adsorption test.

The second selection section 262 includes a checkbox 273 for setting the execution of the adsorption force test to "initialization start time", a checkbox 274 for setting the execution of the adsorption force test to "after setup file change", a checkbox 275 for setting the execution of the adsorption force test to "perform at each contact", a checkbox 276 for setting "number of contacts", a checkbox 277 for setting the execution of the adsorption force test to "after elapsed time", a blank 278 for setting "elapsed time", and a checkbox 279 for setting the execution of the adsorption force test to "perform after an alarm relating to vacuum pump goes off".

Here, "setup file change" refers to product type switching. Further, the "number of contacts" refers to the number of times the device transport arm 17 approaches the test section 16 to hold the IC device 90. The "alarm relating to vacuum pump" refers to an alarm reporting that a jam may be caused by the deterioration of the suction section 51".

As described above, the electronic component handler 10 transports the IC device 90 between the tray 200 as a container in which the IC device 90, which is an electronic component, is placed and the test section 16 testing the electrical characteristics of the IC device 90. The electronic component handler 10 includes the first holding section 41a holding the IC device 90 by adsorption, the second holding section 41b holding the IC device 90 by adsorption, the suction section 51 giving the first holding section 41a and the second holding section 41b the adsorption force F to adsorb the IC device 90, the flow path formation section 35 having the suction flow path 30 which communicates with the suction section 51 and through which gas GS is sucked by the suction section 51, the first branch flow path 31 which branches off from the suction flow path 30 and communicates with the first holding section 41a and through which the gas GS is sucked by the suction section 51, and the second branch flow path 32 which branches off from the suction flow path 30 and communicates with the second holding section 41b and through which the gas GS is sucked by the suction section 51, the first opening/closing section 42a opening and closing the first branch flow path 31, the second opening/closing section 42b opening and closing the second branch flow path 32, the first pressure measurement section 43a measuring the first pressure P1 inside the first branch flow path 31, the second pressure measurement section 43b measuring the second pressure P2 inside the second branch flow path 32, and a control section 800 controlling the operation of the suction section 51, the first opening/closing section 42a, the second opening/closing section 42b, the first pressure measurement section 43a, and the second pressure measurement section 43b. The control section 800 opens the first branch flow path 31 by the first opening/closing section 42a and causes the first holding section 41a to adsorb the IC device 90, and checks whether or not the first pressure P1 measured when the second branch flow path 32 is opened by the second opening/closing section 42b is lower than the threshold value P0 which is preset pressure.

Further, the electronic component handler 10 includes the first holding section 41a as the first head holding the IC device 90 by adsorption, the second holding section 41b as the second head holding the IC device 90 by adsorption, the pump 511 giving the first holding section 41a and the second holding section 41b the adsorption force F to adsorb the IC device 90, the flow path formation section 35 having the suction flow path 30 which communicates with the suction section 51 and through which the gas GS is sucked by the suction section 51, the first branch flow path 31 which branches off from the suction flow path 30 and communicates with the first holding section 41a and through which the gas GS is sucked by the suction section 51, and the second branch flow path 32 which branches off from the suction flow path 30 and communicates with the second holding section 41b and through which the gas GS is sucked by the suction section 51, the first opening/closing section 42a as the first valve opening and closing the first branch flow path 31, the second opening/closing section 42b as the second valve opening and closing the second branch flow path 32, the first pressure measurement section 43a as the first sensor measuring the first pressure P1 inside the first branch flow path 31, the second pressure measurement section 43b as the second sensor measuring the second pressure P2 inside the second branch flow path 32, and the control section 800 having the processor 802. The processor 802 can control the operation of the pump 511, the first opening/closing section 42a, the second opening/closing section 42b, the first pressure measurement section 43a, and the second pressure measurement section 43b respectively. Further, the processor 802 opens the first branch flow path 31 by the first opening/closing section 42a and causes the first holding section 41a to adsorb the IC device 90, and can check whether or not the first pressure P1 measured when the second branch flow path 32 is opened by the second opening/closing section 42b is lower than the threshold value P0.

Further, the electronic component handler 10 transports the IC device 90 between the tray 200 as a container in which the IC device 90, which is an electronic component, is placed and the test section 16 testing the electrical characteristics of the IC device 90. The electronic component handler 10 includes the first holding section 41a holding the IC device 90 by adsorption, the second holding section 41b holding the IC device 90 by adsorption, the suction section 51 giving the first holding section 41a and the second holding section 41b the adsorption force F to adsorb the IC device 90, the flow path formation section 35 having the suction flow path 30 which communicates with the suction section 51 and through which the gas GS is sucked by the suction section 51, the first branch flow path 31 which branches off from the suction flow path 30 and communicates with the first holding section 41a and through which the gas GS is sucked by the suction section 51, and the second branch flow path 32 which branches off from the suction flow path 30 and communicates with the second holding section 41b and through which the gas GS is sucked by the suction section 51, the first opening/closing section 42a opening and closing the first branch flow path 31, the second opening/closing section 42b opening and closing the second branch flow path 32, the first pressure measurement section 43a measuring the first pressure P1 inside the first branch flow path 31 and outputting a signal based on the first pressure P1, the second pressure measurement section 43b measuring the second pressure P2 inside the second branch flow path 32 and outputting a signal based on the second pressure P2, and the control section 800 controlling the operations of the suction section 51, the first opening/closing section 42a, the second opening/closing section 42b, the first pressure measurement section 43a, and the second pressure measurement section 43b respectively. The control section 800 opens the first branch flow path 31 by the first opening/closing section 42a and causes the first holding section 41a to adsorb the IC device 90, and can cause the monitor 300 or the like to report based on the signal of the first pressure measurement section 43a when the second branch flow path 32 is opened by the second opening/closing section 42b.

According to the present disclosure as such, as described above, when the adsorption force F for adsorbing the IC device 90 declines due to the deterioration of the suction section 51, that is, the pump 511, for example, it is possible to detect the deterioration of the adsorption force F. In this way, it is possible to prevent the adsorption force F from declining and from making it difficult to adsorb the IC device 90. Further, if the suction section 51 is replaced with a new suction section 51, it is possible to stably perform the transport of the IC device 90 by the device transport arm 17.

A target of the adsorption force test is the device transport arm 17 in the present embodiment and the present disclosure is not limited thereto. The device transport arm 13 or the device transport arm 20 can be targeted.

Further, when the adsorption force test is performed, the device transport arm 17 holds the IC device from the device supply section 14 in the present embodiment, and the present disclosure is not limited thereto. The IC device 90 may also be held from the test section 16.

Further, the electronic component tester 1 includes the electronic component handler 10 and further includes the test section 16 testing the IC device 90. That is, the electronic component tester 1 tests the IC device 90 transported to the tray 200 as a container in which the IC device 90 is placed and includes the first holding section 41a holding the IC device 90 by adsorption, the second holding section 41b holding the IC device 90 by adsorption, the suction section 51 giving the first holding section 41a and the second holding section 41b the adsorption force F to adsorb the IC device 90, the flow path formation section 35 having the suction flow path 30 which communicates with the suction section 51 and through which the gas GS is sucked by the suction section 51, the first branch flow path 31 which branches off from the suction flow path 30 and communicates with the first holding section 41a and through which the gas GS is sucked by the suction section 51, and the second branch flow path 32 which branches off from the suction flow path 30 and communicates with the second holding section 41b and through which the gas GS is sucked by the suction section 51, the first opening/closing section 42a opening and closing the first branch flow path 31, the second opening/closing section 42b opening and closing the second branch flow path 32, the first pressure measurement section 43a measuring the first pressure P1 inside the first branch flow path 31, the second pressure measurement section 43b measuring the second pressure P2 inside the second branch flow path 32, the test section 16 testing the electrical characteristics of the IC device 90, and a control section 800 controlling the operations of the suction section 51, the first opening/closing section 42a, the second opening/closing section 42b, the first pressure measurement section 43a, and the second pressure measurement section 43b respectively. The control section 800 opens the first branch flow path 31 by the first opening/closing section 42a and causes the first holding section 41a to adsorb the IC device 90, and can check whether or not the first pressure P1 measured when the second branch flow path 32 is opened by the second opening/closing section 42b is lower than the threshold value P0.

In this way, the electronic component tester 1 having the advantages of the electronic component handler 10 described above is obtained. Further, it is possible to transport the IC device 90 to the test section 16, and thereby, it is possible to perform a test on the IC device 90 by the test section 16. Further, it is possible to transport the IC device 90 after the test from the test section 16.

Second Embodiment

In the following, a second embodiment of the electronic component handler and electronic component tester according to the present disclosure will be described with reference to FIG. 19. Differences from the embodiment described above will be mainly described and the description of the same matters will be omitted.

The present embodiment is the same as the first embodiment described above except that the configuration of the electronic component tester is different.

Figure 19:
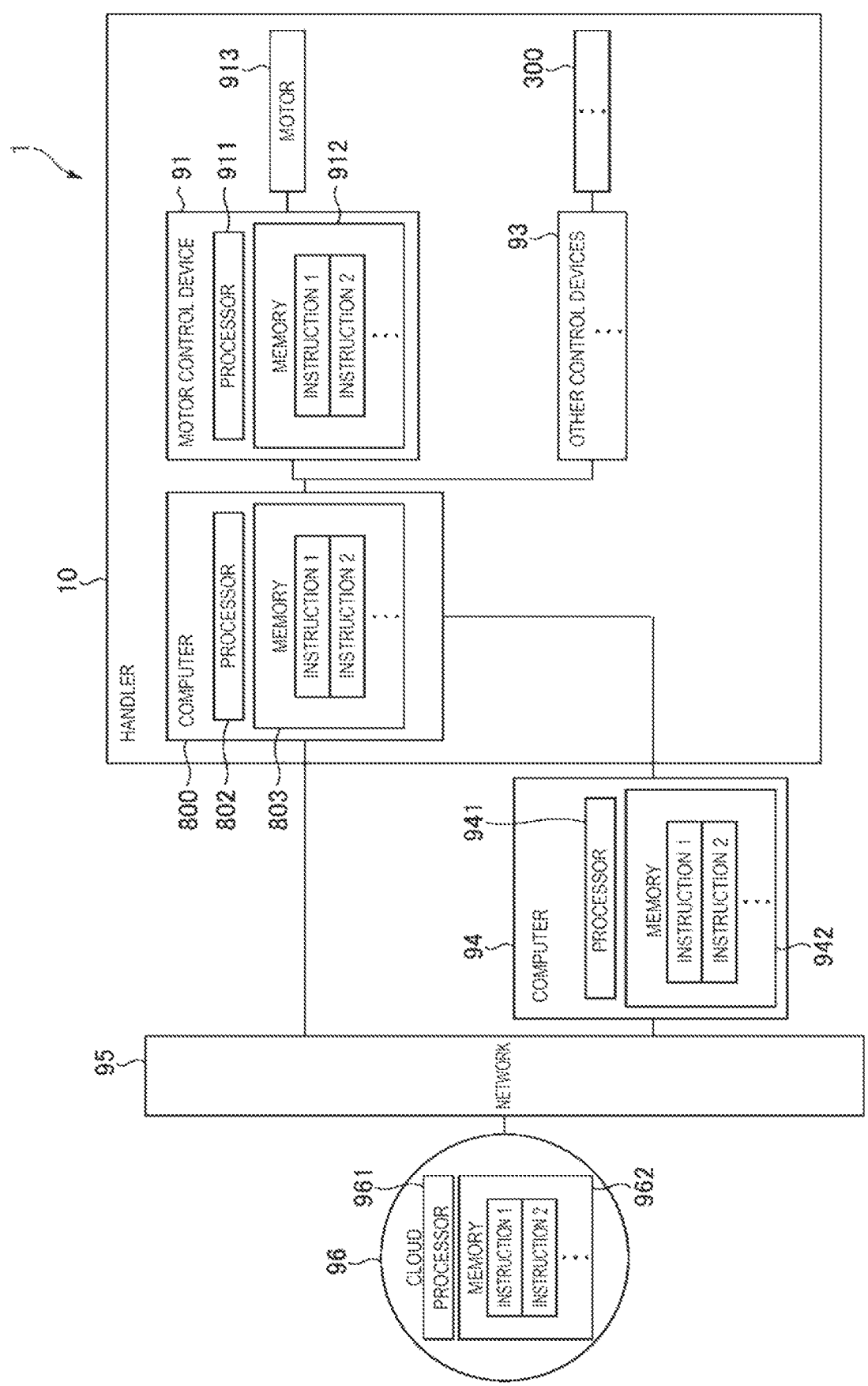
FIG. 19 is a block diagram showing an electronic component tester and a periphery thereof according to a second embodiment.

As shown in FIG. 19, in the present embodiment, the electronic component handler 10 incorporates a motor control device 91 in addition to the control section 800 configured with an industrial computer and further incorporates other control devices 93.

The control section 800 is coupled to the motor control device 91 and other control devices 93. The processor 802 can read an instruction from a memory 803 and execute a control in the control section 800. Further, it is preferable that the control section 800 is coupled to an I/F board coupled to the tester described above.

The motor control device 91 has a processor 911 and a memory 912, and the processor 911 can read an instruction from the memory 912 and execute a control. Then, the motor control device 91 is coupled to a motor 913 and can control the operation of the motor 913. The motor 913 is a driving source driving the tray transport mechanism 11A, the tray transport mechanism 11B, the device transport arm 13, the device supply section 14, the tray transport mechanism 15, the device transport arm 17, the device collection unit 18, the device transport arm 20, the tray transport mechanism 21, the tray transport mechanism 22A, or the tray transport mechanism 22B, for example.

The processor 802 of the control section 800 can read an instruction from the memory 912 of the motor control device 91 and execute a control.

An example of the other control devices 93 includes a device controlling the operation of the monitor 300 and the like.

Further, each control device described above may be separated from, or integrated with, the control target member. The motor control device 91 may be integrated with the motor 913, for example.

Further, the control section 800 is coupled to a computer 94 outside the electronic component handler 10 which is a handler. The computer 94 has a processor 941 and a memory 942. Then, the processor 802 of the control section 800 can read an instruction from the memory 942 and execute a control.

Further, the computer 94 is coupled to a cloud 96 through a network 95 such as a LAN or the like. The cloud 96 has a processor 961 and a memory 962. Then, the processor 802 of the control section 800 can read an instruction from the memory 962 and execute a control. The control section 800 may be directly coupled to the network 95.

Third Embodiment

In the following, a third embodiment of the electronic component handler and the electronic component tester according to the present disclosure will be described with reference to FIG. 20. Mainly differences from the embodiments described above will be described, and the description of the same matter will be omitted.

The present embodiment is the same as the second embodiment described above except that the configuration of the electronic component tester is different.

Figure 20:
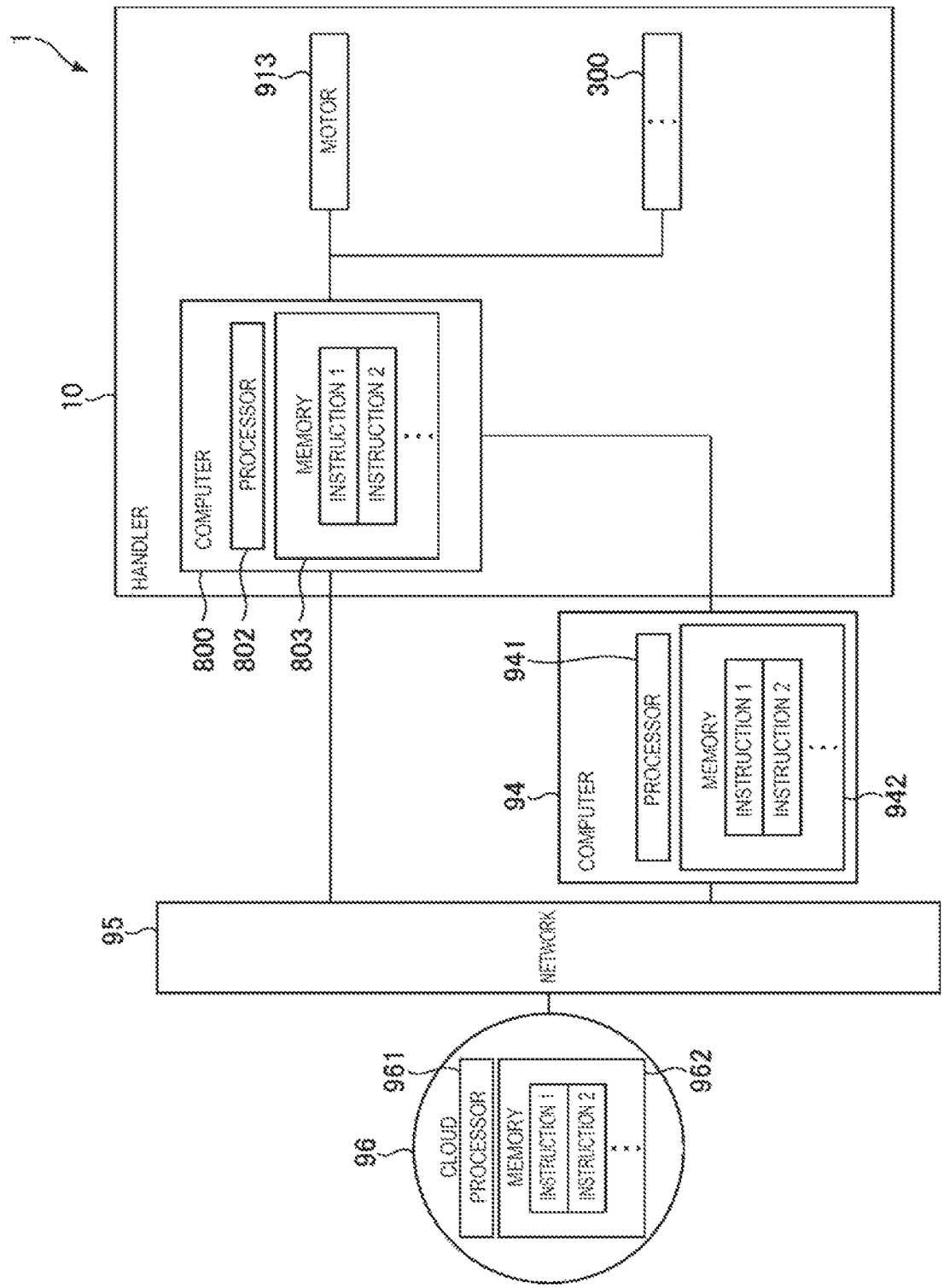
FIG. 20 is a block diagram showing an electronic component tester and a periphery thereof according to a third embodiment.

In the present embodiment shown in FIG. 20, the control section 800 is configured to have a control function of the motor control device 91 and the control function of other control devices 93. That is, the control section 800 is configured to incorporate (integrate with) the motor control device 91 and other control devices 93. Such a configuration contributes to the downsizing of the control section 800.

Hitherto, the embodiments of the electronic component handler and the electronic component tester according to the present disclosure are described, and the present disclosure is not limited thereto. Each part constituting the electronic component handler and the electronic component tester can be replaced with any configuration capable of performing the same functions. Further, any component may be added.

Further, two or more of the configurations and the characteristics of each embodiment described above of the electronic component handler and the electronic component tester according to the present disclosure may be combined.

What is claimed is:
1. An electronic component handler transporting a first electronic component and a second electronic component to a test section testing electrical characteristics of the first electronic component and the second electronic component, the handler comprising:
    a first holding section holding the first electronic component by adsorption;
    a second holding section holding the second electronic component by adsorption;
    a suction section giving the first holding section an adsorption force to adsorb the first electronic component and giving the second holding section the adsorption force to adsorb the second electronic component;
    a suction flow path which communicates with the suction section and through which gas is sucked by the suction section;
a first branch flow path which branches off from the suction flow path and communicates with the first holding section and through which the gas is sucked by the suction section;
    a second branch flow path which branches off from the suction flow path and communicates with the second holding section and through which the air is sucked by the suction section;
    a first opening/closing section opening and closing the first branch flow path;
    a second opening/closing section opening and closing the second branch flow path;
    a first pressure measurement section measuring first pressure inside the first branch flow path;
    a second pressure measurement section measuring second pressure inside the second branch flow path; and a control section controlling operations of the suction section, the first opening/closing section, the second opening/closing section, the first pressure measurement section, and the second pressure measurement section, wherein the control section opens the first branch flow path by the first opening/closing section and causes the first holding section to adsorb the first electronic component, and checks whether or not the first pressure measured when the second branch flow path is opened by the second opening/closing section is lower than preset pressure.

2. The electronic component handler according to claim 1, wherein the control section opens the second branch flow path by the second opening/closing section and causes the second holding section to adsorb the second electronic component, and checks whether or not the second pressure measured when the first branch flow path is opened by the first opening/closing section is lower than the pressure.

3. The electronic component handler according to claim 2, wherein the control section determines that a decline of the adsorption force occurs when the first pressure is lower than the pressure and the second pressure is lower than the pressure.

4. The electronic component handler according to claim 3, further comprising:

a report section reporting a determination result of the control section.

5. An electronic component handler transporting a first electronic component and a second electronic component to a test section testing electrical characteristics of the first electronic component and the second electronic component, the handler comprising:

a first holding section holding the first electronic component by adsorption;

a second holding section holding the second electronic component by adsorption;

a suction section giving the first holding section an adsorption force to adsorb the first electronic component and giving the second holding section the adsorption force to adsorb the second electronic component;

a suction flow path which communicates with the suction section and through which gas is sucked by the suction section;

a first branch flow path which branches off from the suction flow path and communicates with the first holding section and through which the gas is sucked by the suction section;

a second branch flow path which branches off from the suction flow path and communicates with the second holding section and through which the gas is sucked by the suction section;

a first opening/closing section opening and closing the first branch flow path;

a second opening/closing section opening and closing the second branch flow path;

a first pressure measurement section measuring first pressure inside the first branch flow path and outputting a signal based on the first pressure;

a second pressure measurement section measuring second pressure inside the second branch flow path and outputting a signal based on the second pressure;

a control section controlling operations of the suction section, the first opening/closing section, the second opening/closing section, the first pressure measurement section, and the second pressure measurement section; and a report section, wherein the control section opens the first branch flow path by the first opening/closing section and causes the first holding section to adsorb the first electronic component, and causes the report section to report based on the signal of the first pressure measurement section when the second branch flow path is opened by the second opening/closing section.

6. The electronic component handler according to claim 5, wherein the first pressure measurement section outputs a first signal when the first pressure is lower than a preset pressure threshold value, and the control section causes the report section to report upon receiving the first signal from the first pressure measurement section.

7. An electronic component tester testing a first electronic component and a second electronic component, the tester comprising:

a first holding section holding the first electronic component by adsorption;

a second holding section holding the second electronic component by adsorption;

a suction section giving the first holding section an adsorption force to adsorb the first electronic component and giving the second holding section the adsorption force to adsorb the second electronic component;

a suction flow path which communicates with the suction section and through which gas is sucked by the suction section;

a first branch flow path which branches off from the suction flow path and communicates with the first holding section and through which the gas is sucked by the suction section;

a second branch flow path which branches off from the suction flow path and communicates with the second holding section and through which the gas is sucked by the suction section;

a first opening/closing section opening and closing the first branch flow path;

a second opening/closing section opening and closing the second branch flow path;

a first pressure measurement section measuring the first pressure inside the first branch flow path;

a second pressure measurement section measuring the second pressure inside the second branch flow path;

a test section testing electrical characteristics of the first electronic component and the second electronic component; and a control section controlling operations of the suction section, the first opening/closing section, the second opening/closing section, the first pressure measurement section, and the second pressure measurement section, wherein the control section opens the first branch flow path by the first opening/closing section and causes the first holding section to adsorb the first electronic component, and checks whether or not the first pressure measured when the second branch flow path is opened by the second opening/closing section is lower than preset pressure.

8. The electronic component tester according to claim 7, wherein the control section opens the second branch flow path by the second opening/closing section and causes the second holding section to adsorb the second electronic component, and checks whether or not the second pressure measured when the first branch flow path is opened by the first opening/closing section is lower than the pressure.

9. The electronic component tester according to claim 8, wherein the control section determines that a decline of the adsorption force occurs when the first pressure is lower than the pressure and the second pressure is lower than the pressure.

10. The electronic component tester according to claim 9, further comprising:

a report section reporting a determination result of the control section.

* * * * *